United States Patent
Zenou et al.

(10) Patent No.: US 11,877,398 B2
(45) Date of Patent: Jan. 16, 2024

(54) PCB PRODUCTION BY LASER SYSTEMS

(71) Applicant: IO Tech Group Ltd., London (GB)

(72) Inventors: Michael Zenou, Hashmonaim (IL); Guy Nesher, Nes Ziona (IL)

(73) Assignee: IO Tech Group Ltd., Modiin (IL)

(*) Notice: Subject to any disclaimer, the term of this patent is extended or adjusted under 35 U.S.C. 154(b) by 368 days.

(21) Appl. No.: 17/249,217

(22) Filed: Feb. 24, 2021

(65) Prior Publication Data

US 2022/0256698 A1    Aug. 11, 2022

Related U.S. Application Data

(60) Provisional application No. 63/200,034, filed on Feb. 11, 2021.

(51) Int. Cl.
*H05K 1/11* (2006.01)
*H05K 13/04* (2006.01)
*H05K 3/34* (2006.01)

(52) U.S. Cl.
CPC .......... *H05K 1/111* (2013.01); *H05K 3/341* (2013.01); *H05K 13/046* (2013.01); *H05K 2201/10666* (2013.01)

(58) Field of Classification Search
None
See application file for complete search history.

(56) References Cited

U.S. PATENT DOCUMENTS

| | | | |
|---|---|---|---|
| 4,098,612 A | 7/1978 | Rhodes et al. | |
| 4,174,973 A | 11/1979 | Rhodes et al. | |
| 5,059,266 A | 10/1991 | Yamane et al. | |
| 5,096,862 A | 3/1992 | Mathers et al. | |
| 5,204,055 A | 4/1993 | Sachs et al. | |
| 5,231,062 A | 7/1993 | Mathers et al. | |

(Continued)

FOREIGN PATENT DOCUMENTS

| | | |
|---|---|---|
| JP | S5456847 A | 5/1979 |
| JP | S62244650 A | 10/1987 |

(Continued)

OTHER PUBLICATIONS

Non-Final Office Action dated Oct. 6, 2022, for U.S. Appl. No. 17/649,100 (filed Jan. 27, 2022), 9 pgs.

(Continued)

*Primary Examiner* — Stanley Tso
(74) *Attorney, Agent, or Firm* — Ascenda Law Group, PC

(57) ABSTRACT

Systems and methods for printing a printed circuit board (PCB) from substrate to full integration utilize a laser-assisted deposition (LAD) system to print a flowable material on top of a substrate by laser jetting to create a PCB structure to be used as an electronic device. One such system for PCB printing includes a jet printing unit, an imaging unit, curing units, and a drilling unit to print metals and other materials (epoxies, solder masks, etc.) directly on a PCB substrate such as a glass-reinforced epoxy laminate material (e.g., FR4) or others. The jet printing unit can also be used for sintering and/or ablation of materials. Printed materials are cured by heating or by infrared (IR) or ultraviolet (UV) radiation. PCBs produced according to the present systems and methods may be single-sided or double-sided.

29 Claims, 52 Drawing Sheets

(56) References Cited

U.S. PATENT DOCUMENTS

| | | | |
|---|---|---|---|
| 5,506,607 | A | 4/1996 | Sanders, Jr. et al. |
| 5,590,454 | A | 1/1997 | Richardson |
| 5,703,341 | A * | 12/1997 | Lowndes ............... B23K 26/32 |
| | | | 219/121.66 |
| 5,740,051 | A | 4/1998 | Sanders, Jr. et al. |
| 5,902,441 | A | 5/1999 | Bredt et al. |
| 6,270,335 | B2 | 8/2001 | Leyden et al. |
| 6,322,728 | B1 | 11/2001 | Brodkin et al. |
| 6,660,209 | B2 | 12/2003 | Leyden et al. |
| 6,921,500 | B1 | 7/2005 | Feenstra |
| 6,939,489 | B2 | 9/2005 | Moszner et al. |
| 6,955,776 | B1 | 10/2005 | Feenstra |
| 7,189,344 | B2 | 3/2007 | Rheinberger et al. |
| 7,198,879 | B1 | 4/2007 | Tredwell et al. |
| 9,592,105 | B2 | 3/2017 | Hauptmann et al. |
| 2002/0006532 | A1 | 1/2002 | Robin |
| 2002/0122898 | A1 | 9/2002 | Ringeisen et al. |
| 2004/0032459 | A1 | 2/2004 | Te |
| 2004/0094058 | A1 | 5/2004 | Kasperchik et al. |
| 2006/0051533 | A1 | 3/2006 | Song et al. |
| 2006/0072944 | A1 | 4/2006 | Sharma et al. |
| 2007/0046304 | A1 * | 3/2007 | Mok ....................... G01R 3/00 |
| | | | 324/750.05 |
| 2008/0001297 | A1 | 1/2008 | Lotz et al. |
| 2011/0209749 | A1 * | 9/2011 | Yang ............... H01L 31/022425 |
| | | | 361/679.01 |
| 2012/0302003 | A1 * | 11/2012 | Shieh ............... H01L 29/66969 |
| | | | 257/E21.46 |
| 2014/0253392 | A1 * | 9/2014 | Yarga .................... H01Q 5/371 |
| | | | 343/702 |
| 2014/0272121 | A1 | 9/2014 | Ng et al. |
| 2015/0033557 | A1 | 2/2015 | Kotler et al. |
| 2015/0037445 | A1 | 2/2015 | Murphy et al. |
| 2015/0201500 | A1 | 7/2015 | Shinar et al. |
| 2016/0198576 | A1 | 7/2016 | Lewis et al. |
| 2017/0189995 | A1 | 7/2017 | Zenou et al. |
| 2018/0024254 | A1 * | 1/2018 | Roy ........................ G01T 1/241 |
| | | | 250/370.12 |
| 2018/0050550 | A1 * | 2/2018 | Batt ........................ B33Y 10/00 |
| 2018/0071989 | A1 | 3/2018 | Zenou et al. |
| 2019/0019736 | A1 * | 1/2019 | Schrauben ............ H01L 21/486 |
| 2019/0035550 | A1 * | 1/2019 | Yosui ...................... H05K 1/181 |
| 2019/0312009 | A1 * | 10/2019 | Arvin ....................... H01L 24/82 |
| 2019/0322036 | A1 | 10/2019 | Zenou et al. |
| 2020/0261191 | A1 | 8/2020 | Zenou et al. |
| 2020/0350275 | A1 | 11/2020 | Zenou et al. |
| 2021/0059045 | A1 | 2/2021 | Mikage et al. |
| 2022/0208701 | A1 * | 6/2022 | Koduri .................... H01L 24/97 |

FOREIGN PATENT DOCUMENTS

| | | |
|---|---|---|
| WO | 2009/035854 A1 | 3/2009 |
| WO | 2014/078537 A1 | 5/2014 |
| WO | 2020/205691 A1 | 10/2020 |

OTHER PUBLICATIONS

International Search Report and Written Opinion dated Apr. 7, 2020, from the ISA/European Patent Office, for International Application No. PCT/IB2020/050664 (filed Jan. 28, 2020), 13 pages.

International Search Report and Written Opinion dated Jul. 18, 2019, from the ISA/European Patent Office, for International Patent Application No. PCT/IB2019/053086 (filed Apr. 15, 2019), 15 pages.

Written Opinion of the International Preliminary Examining Authority dated Feb. 17, 2020, from the IPEA/European Patent Office, for International Patent Application No. PCT/IB2019/053086 (filed Apr. 15, 2019), 7 pages.

International Preliminary Report on Patentability dated Sep. 24, 2020, from the IPEA/European Patent Office, for International Patent Application No. PCT/IB2019/053086 (filed Apr. 15, 2019), 12 pages.

Amendment filed Jan. 6, 2023, for U.S. Appl. No. 17/649,100 (filed Jan. 27, 2022), 5 pgs.

International Search Report and Written Opinion dated May 13, 2022, from the ISA/European Patent Office, for International Patent Application No. PCT/IB2022/051215 (filed Feb. 10, 2022), 12 pgs.

International Preliminary Report on Patentability dated Jan. 18, 2023, from the IPEA/European Patent Office, for International Patent Application No. PCT/IB2022/051215 (filed 10 Feb. 2022), 51 pgs.

* cited by examiner

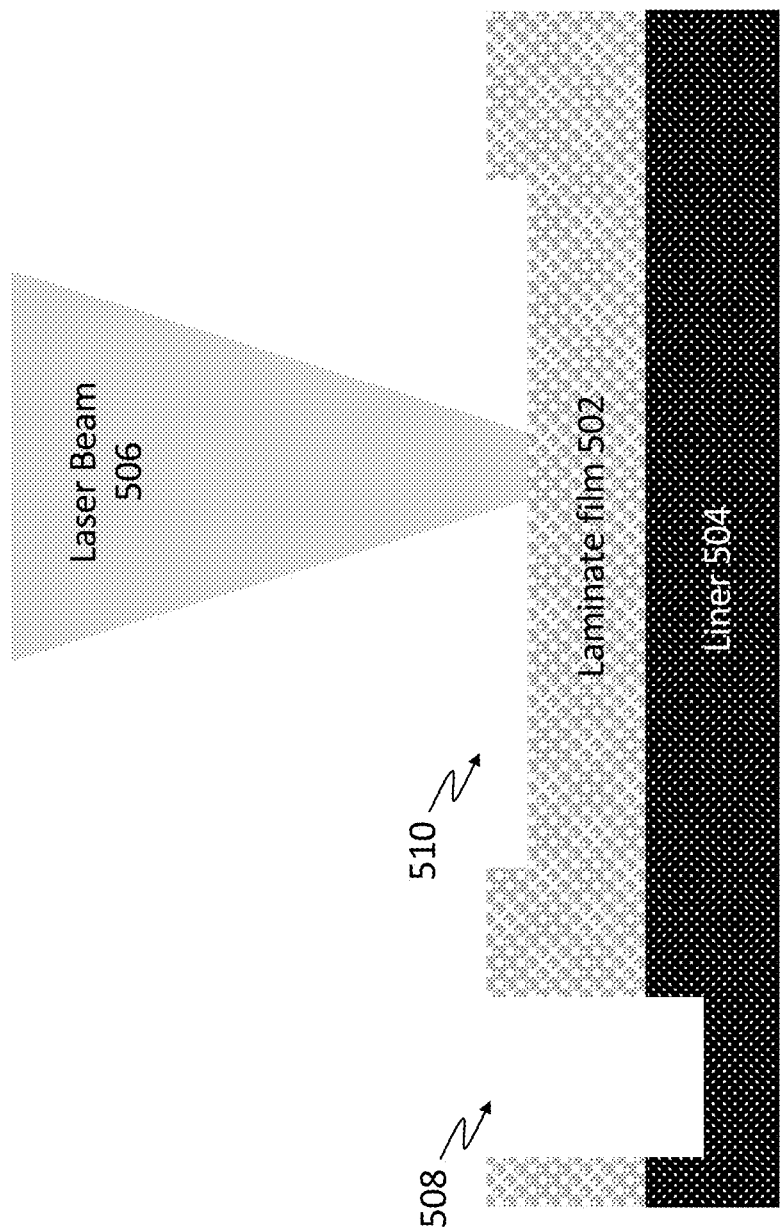

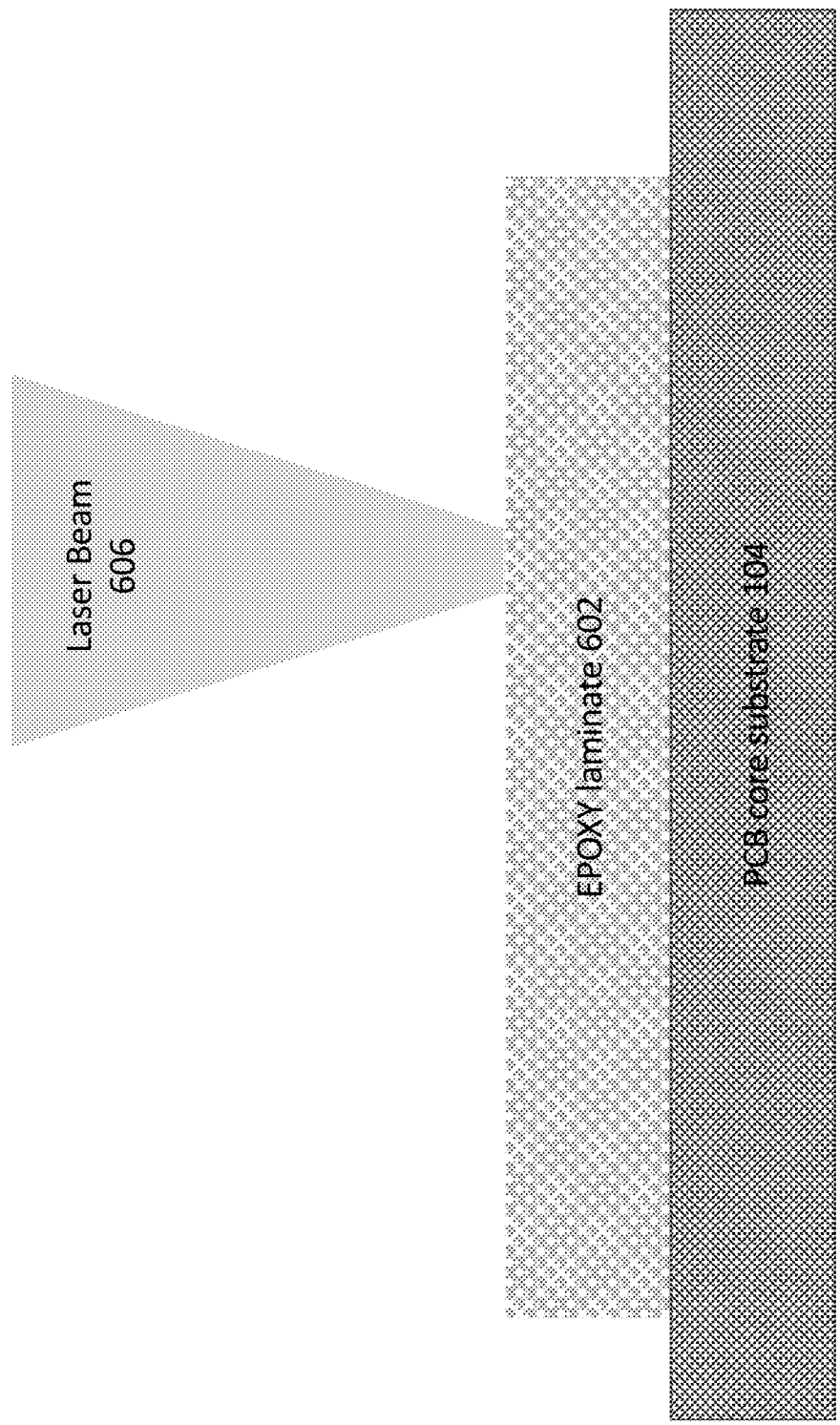

PCB PRODUCTION BY LASER SYSTEMS

RELATED APPLICATIONS

This is a NONPROVISIONAL of, claims priority to, and incorporates by reference U.S. Provisional Application No. 63/200,034, filed 11 Feb. 2021.

FIELD OF THE INVENTION

The present invention relates to systems and methods for printing a printed circuit board (PCB) or a flexible PCB from substrate to full integration.

BACKGROUND

Surface Mount Technology (SMT) is an area of electronic assembly used to mount electronic components to the surface of a PCB as opposed to inserting components through holes in the PCB as in conventional assembly. SMT was developed to reduce manufacturing costs and allow efficient use of PCB space. As a result of the introduction of SMT and ever-increasing levels of automation, it is now possible to build highly complex electronic circuits into smaller and smaller assemblies with good repeatability.

The recent trend toward miniaturization creates a need for the fabrication of highly integrated PCBs. Printed circuit boards are generally fabricated by lithography using extractive methods, for example etching. Such a fabrication method provides formation of conductive lines by placing a conductive film on a substrate and etching away unnecessary portions of the conductive film to dissolution-remove a portion of the conductive film, where there are no circuits, with a corrosive solution and thereby to leave only necessary conductive lines. In addition, to improve integration, multi-layered printed circuit boards and double-sided printed circuit boards are required. Current fabrication of multi-layered printed circuit boards requires complicated processes including drilling to form through or via holes in order to enable conduction between multilayer boards, laminating the boards and soldering to adhere elements to the printed circuit board. When soldering is performed to adhere elements to the printed circuit board, a region, where a solder is melted and spread, is further required and the elements are thus located in an area wider than the size of elements themselves, which limits miniaturization. Therefore, there is a need for devices and methods enabling efficient and precise fabrication of complex circuit boards.

Flexible-rigid composite electronics represent a new generation of electronics, which can exhibit properties of both stretching as well as bending flexibility. These properties will afford electronic devices with conformity to bending and twisting as well as the capability to stretch and compress over a large strain scale. Because of their soft and conformable nature, stretchable electronics have shown great potential in biomedical engineering, e.g., epidermal electronic devices and implantable devices. As well as in the growing demand for wearable electronics, and other industries such as sensors, antennas with complex geometry, or radio frequency identification (RFID) tags to be placed on curved objects.

Progress in the field of flexible electronics is expected to play a critical role in a number of important emerging technologies. For example, flexible sensor arrays, electronic paper, wearable electronic devices, and large area flexible active matrix displays. In addition, development of flexible integrated electronic systems and processing methods is also expected to significantly impact several other important technologies including micro- and nano-fluidics, sensors and smart skins, RFID, information storage, and micro- and nanoelectromechanical systems.

Flexible electronics refers currently to a technology for building electronic circuits by depositing electronic devices onto flexible substrates. Fabricating flexible electronics with performance that is equal to conventional (rigid) microelectronics built on brittle semiconductor wafers, but capable of optical transparency, being light-weight, stretchable/bendable formats, and being easy to print rapidly over large areas has been shown to enable diverse applications, such as flexible displays, thin film solar cells, and large area sensors and actuators. In all of these applications, the flexibility of both the circuits and the components incorporated on them represents important differences from typically rigid circuits. To date, it has proven to be a challenge to design a bendable (governed by Young's modulus, a modulus of elasticity describing a material property or parameter which is equal to a ratio between a mechanical tension and a corresponding elongation and thus a measure of the stiffness of a material) and stretchable (governed by Poisson's ratio, referring to the measurement of the relative change in width with a change in length, or the tendency of the component to "neck in" during stretching) electronics based on inorganic materials due to their small fracture strain (high Young's modulus and Poisson ratio of 1). A typical embodiment of flexible electronics are thin film inorganics adopted as semiconductors, conductors, and/or insulators on substrates to minimize strains induced by bending or stretching. Another embodiment is represented by circuits in wavy patterns, which can offer fully reversible stretchability/ compressibility without substantial strains in the circuit materials themselves.

SUMMARY OF THE INVENTION

The present inventors have recognized that it is desirable to have a "one stop shop" for the production of PCB s; replacing a highly complex technology that presently utilizes approximately 20 stages to produce a single PCB board, not including electronic component placement on the board, by a machine that performs all the production stages and can even effect electronic component placement on the board.

Accordingly, the present invention relates to systems and methods for printing a PCB (rigid or flexible) from substrate to full integration. Various embodiments of the invention utilize a laser-assisted deposition (LAD) system to print a flowable material on top of a substrate by laser jetting to create a PCB structure to be used as an electronic device in a production line. In one embodiment, a system for PCB printing includes a jet printing unit, an imaging unit, curing units, and a drilling unit that print directly on a board substrate such as a glass-reinforced epoxy laminate material (e.g., FR4) or others. The jet printing unit can also be used for sintering and/or ablation of materials. Such a system can print copper and gold pastes, epoxies, and solder masks and cure them by heating or by ultraviolet (UV) radiation. Such a system can also print epoxy in joints of copper lines, e.g., where the epoxy layer is printed as a bridge on top of copper line on the PCB board. PCB boards produced according to the present systems and methods may be one-sided or double-sided.

In one embodiment, the present invention provides a method of fabricating of a PCB assembly in which a metal layer is deposited on a PCB substrate by LAD in which metal droplets from a donor substrate are jetted onto the PCB substrate and/or into one or more holes therein using a laser to form a layer of metal on the PCB substrate. The layer of metal is subsequently dried and sintered, and the jetting, drying, and sintering are repeated until the layer of metal reaches a desired thickness. Thereafter at least one passivation layer is formed over the layer of metal. If needed, the layer of metal may be ablated (e.g., using the same laser as was used for the deposition) if it exceeds the desired thickness. The passivation layer may be a layer of epoxy that is deposited or coated over the metal layer using a roller or blade. Or the passivation layer may be a layer of epoxy printed over the metal layer from an epoxy coat on a donor substrate by LAD. If needed, one or more additional metal layers and epoxy layers may be likewise printed using LAD. The layer of epoxy may be cured by hot air and/or infrared (IR) irradiation.

In some instances, the layer of metal will include a first metal trace, and the epoxy layer will include at least a first portion of epoxy that covers at least a first portion of the first metal trace. Additional metal layers printed over the epoxy layer may thus include a second metal trace having at least a portion disposed over the first portion of the epoxy layer that covers the first portion of the first metal trace. That is, the epoxy layer may form a bridge over which the second metal trace can cross the first metal trace on the same dies of the PCB substrate without causing a short circuit.

In some cases, the one or more holes in the PCB substrate will be formed in a first side of the PCB substrate by drilling or laser engraving the first side of the PCB substrate, but those holes will not pass through an entire thickness of the PCB substrate. Then, the layer of metal may be formed in the one or more holes by LAD from the first side of the PCB substrate; that is, the side on which the holes are present. Subsequently, the PCB substrate may be flipped and the one or more holes completed through the thickness of the PCB substrate by drilling or laser engraving through the second (reverse) side of PCB substrate. Thereafter, remaining portions of the one or more holes exposed by the drilling or laser engraving through the second (reverse) side of PCB substrate may be metalized by LAD in the fashion discussed above.

Where desired or needed, a solder mask layer is printed, e.g., by LAD, over the passivation layer and any intervening layers and/or components of the PCB assembly. Also, a label may be printed, e.g., by LAD, over the solder mask. As needed, holes and vias in the various layers, including the solder mask, are formed and metalized by LAD so as to provide electrical connections to the metal layers in the PCB assembly and to provide attachment points for electronic components.

In further embodiments, the present invention provides a method of fabricating of a PCB assembly that includes printing, by LAD, a metal onto an epoxy laminate, the metal being jetted as droplets from a metal coating or foil on a donor substrate by a laser into channels and/or holes created in the epoxy laminate by laser engraving, and subsequently attaching the epoxy laminate to a PCB substrate or a previously formed epoxy layer disposed over a PCB substrate by hot pressing, with the metal jetted into the channels and/or holes of the epoxy laminate being between the PCB substrate and an upper surface of the epoxy laminate in the portion of the PCB assembly. A solder mask layer may be printed, by LAD or otherwise, over the upper surface of the epoxy laminate and any intervening layers and/or components of the PCB assembly, and a label printed on the solder mask.

In yet additional embodiments, the present invention provides a system for fabricating a PCB assembly in which a substrate holder, configured to hold a PCB substrate, is translatable between a plurality of processing stations, including a printing station configured for LAD of one or more materials (e.g., copper and gold pastes, epoxy, and solder mask material, etc.) by jetting respective ones of the materials individually from respective donor substrates on which the respective ones of said materials are coated or otherwise disposed, a curing station configured to cure by heating, IR irradiation, or UV irradiation, deposited ones of the materials on the PCB substrate, and a drilling station configured to drill or engrave through holes and/or vias in the PCB substrate and/or layers of ones of the materials disposed thereon. The printing station may also be configured for laser sintering and/or laser ablation of the respective ones of the materials printed on the PCB substrate and/or additional layers of said PCB assembly. A unit configured to flip the PCB substrate to allow access to both sides of the PCB substrate by the printing station, curing station, and/or drilling station may also be provided.

In yet another embodiment, the present invention provides a method for fabricating a printed circuit board PCB assembly in which one or more vias are drilled or laser engraved in a PCB substrate from a first side of the PCB substrate. The vias do not extend through an entire thickness of the PCB substrate. A metal paste is deposited, by LAD, over at least a first portion of the PCB substrate and into one or more of the vias to a first thickness. The depositing is performed by jetting small volumes of metal paste from a donor film on a first carrier substrate by an incident laser beam onto the PCB substrate and into the one or more vias, curing the metal paste deposited on the PCB substrate and into the one or more vias, sintering the deposited and cured metal paste using a same laser that was used for depositing the metal paste, and repeating the depositing, curing and sintering of the metal paste, thereby forming successive thicknesses thereof on the PCB substrate and in the one or more vias, until a desired thickness of the metal paste on the PCB substrate and in the one or more vias is reached. Then a passivation layer is printed by LAD on the desired thickness of metal paste on the PCB substrate and in the one or more vias; the printing being performed by jetting small volumes of epoxy from a second carrier substrate using the same laser that was used for depositing the metal paste, and curing the passivation layer. Finally, a solder mask is formed by LAD over the passivation layer, with the formation involving jetting of small volumes of solder mask material from a third carrier substrate using the same laser that was used for depositing the metal paste, and curing the solder mask. The solder mask layer, passivation layer, and metal paste layer(s) may be cured using heat, or IR or UV radiation.

In various instances, the PCB substrate is moved between the drilling, the depositing, the printing, and the forming processes on a stage that is translatable between positions at which the drilling, the depositing, the printing, and the forming processes take place. Also, the processes of depositing the metal paste and printing the passivation layer may be performed multiple times prior to forming the solder mask so as to produce a PCB assembly having multiple layers of both metal paste and epoxy between the PCB substrate and the solder mask (e.g., on one or both sides of the PCB substrate). Metal electrical connectors for an electronic component may be formed within the passivation layer and/or the solder mask and the metal electrical connectors may be formed from different metals (e.g., Cu, Au, Ag, etc.). One or more electronic components may be attached to the metal electrical connectors, e.g., by one or more solder joints and in some instances one or more additional passivation layers and/or solder mask layers may be formed over the electronic component. Where needed, support structures for the electronic components may be formed by LAD prior to attaching the electronic components. Also, as discussed above, epoxy bridges may be used to avoid short circuits between different layers of electrical traces.

These and further embodiments of the invention are described in greater detail below.

BRIEF DESCRIPTION OF THE DRAWINGS

The present invention is illustrated by way of example, and not limitation, in the figures of the accompanying drawings, in which:

FIGS. 5a-5c illustrate additional methods to create a PCB by engraving solid laminate (FIG. 5a), printing a metal layer onto the laminate (FIG. 5b), and drying and pressing against the former layers (FIG. 5c).

FIGS. 6a-6c illustrate yet additional methods to create a PCB by engraving solid laminate after pressing against the former layers (FIG. 6a), and then printing the metal layer onto the laminate (FIG. 6b) and drying (FIG. 6c).

DESCRIPTION OF THE INVENTION

Figure 1A:
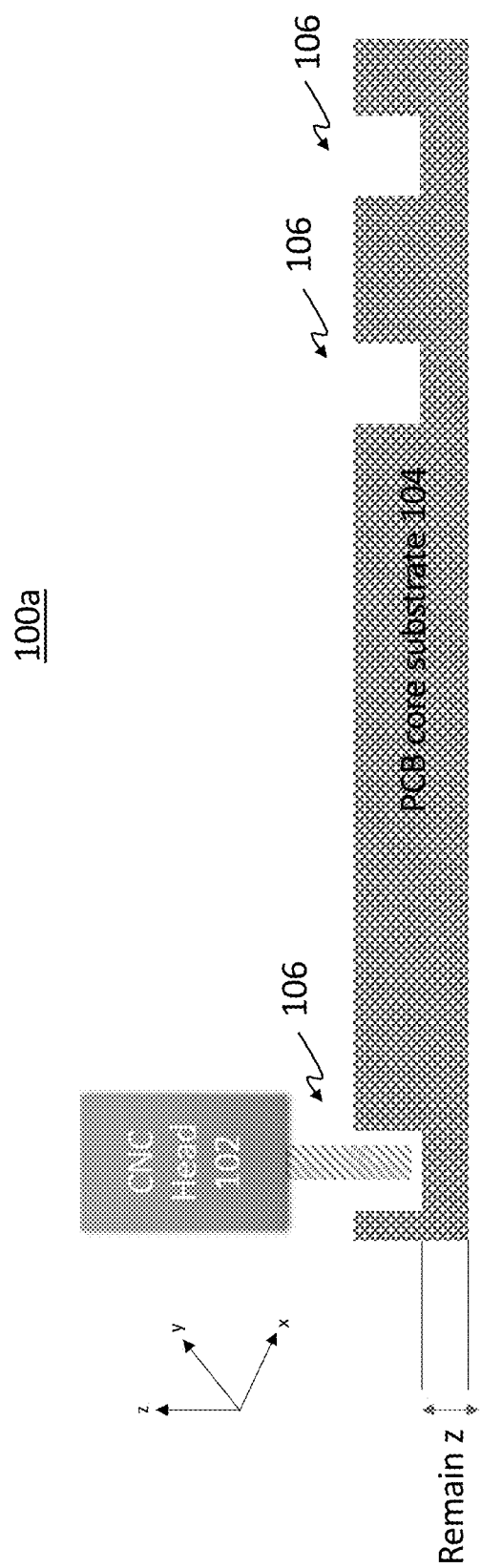
FIGS. 1a-1d illustrate, in a conceptual manner, different processes for creating a via in a PCB.

PCB production is a highly developed field with a significant number of stages. The current invention is aiming at simplifying the production process through provision and use of a single system with several sub modules that can construct a PCB from the prepreg and laminate level up to a fully developed board with embedded electronics as a one-shop-stop. Systems and methods configured in accordance with the present invention need not necessarily employ different materials that are used today for conventional PCB production (although such new materials may be used), but may instead use those same materials in new and different ways. Hence, in various embodiments the present invention relates to systems and methods for printing PCB or a flexible PCB, from substrate level to full integration. As described below, embodiments of the invention may utilize LAD systems to print any flowable material on top of a substrate by laser jetting to create a PCB structure to be used as an electronic device in a production line.

The first stage in the PCB production involves drilling vias in the board substrate. As illustrated in FIGS. 1a-1d, any of several approaches can be taken. For example, and referring to FIG. 1a, in a PCB board production system 100a a CNC machine 102 may be used for drilling into a PCB core substrate board 104. As indicated, the PCB core substrate board 104 may be made of a glass-reinforced epoxy laminate such as FR4. Modules of this kind, including those with an additional cleaning unit for removal of drilling waste, are used widely today. The CNC head 102 is mounted on an stage (not shown) that is moveable in three dimensions, and the substrate board 104 is held flat from its sides or on a sacrificial substrate (not shown in this view). The drilling head 102 creates holes 106, optionally with different diameters, at desired locations on the board 104. In the current system it is beneficial to drill only vias and not through holes because a laser can be used to remove extra material after the board is flipped, simplifying the placement of copper paste in the holes and keeping the substrate holder clean (through holes can contaminate the holder surface).

Figure 1B:
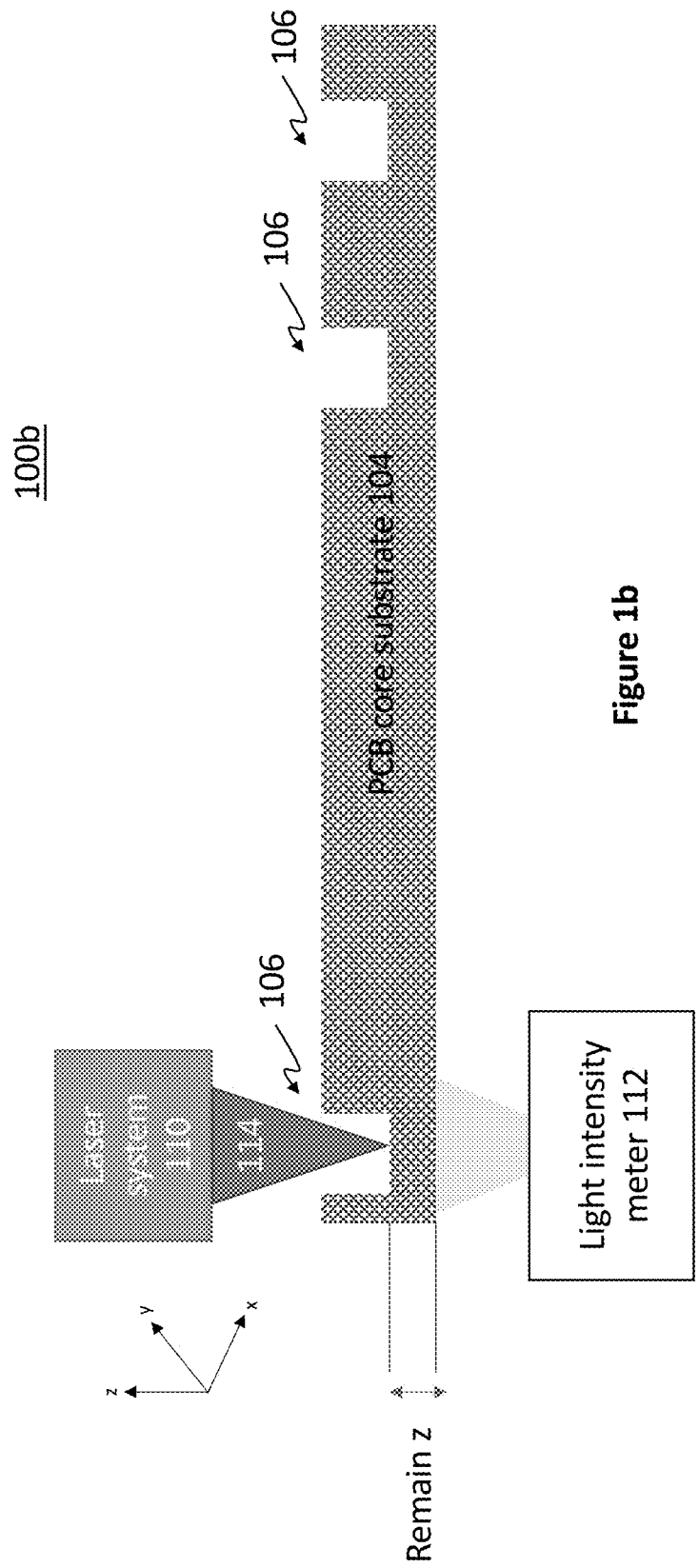
Figure 1C:
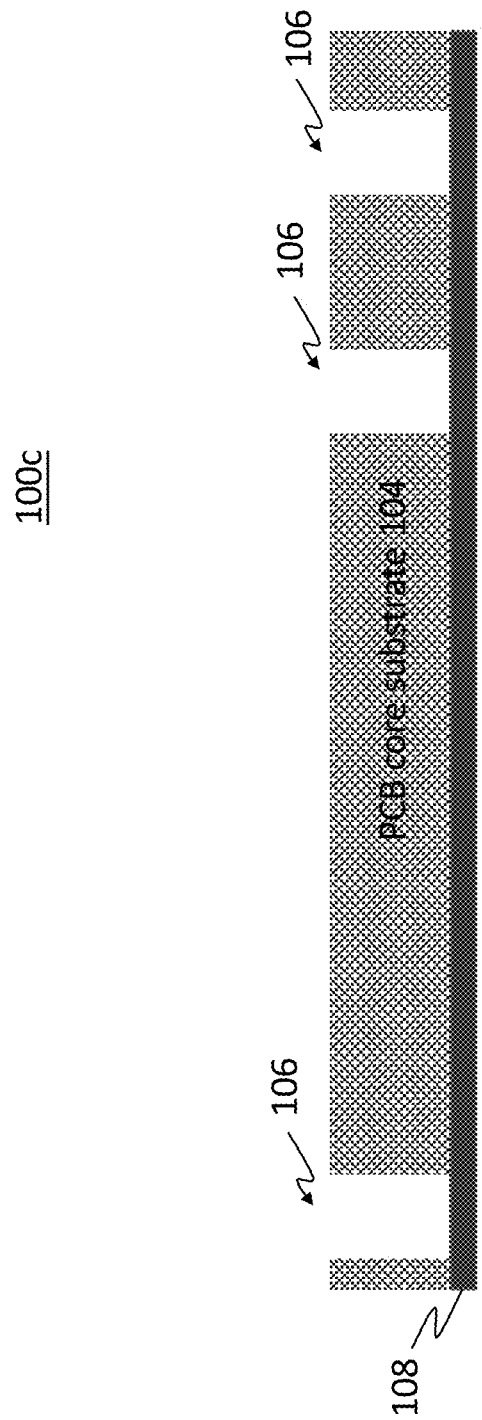

As explained below, other aspects of the PCB board production system are laser-based. Therefore, rather than using a CNC drill head, all of the engraving or cutting involved in the production of a PCB, including the formation of vias, can be done using the laser. To that end, FIG. 1b illustrates an embodiment of a PCB board production system 100b that engraves the vias using a laser system 110. When laser 110 is used, a power or light intensity meter 112 can be used to evaluate the hole depth. By measuring the light intensity at the location of a via during laser drilling, the via hole depth can be evaluated (e.g., by table lookup or other means) so that the drilling is stopped before the hole passes through the entire thickness of the board substrate 104 (e.g., so that a thickness "z" of the substrate remains). The light intensity measured may be that of the cutting laser beam 114 itself or of a separate light source (e.g., one positioned above the cutting position).

As mentioned, drilling/cutting only vias and not through holes simplifies the cleaning of a substrate holder. However, referring to the PCB board production system 100c shown in FIG. 1c, another solution that may be employed is the addition of a peelable substrate 108 beneath the PCB substrate 104. For example, the peelable substrate 108 may be added to one side of the PCB substrate 104 and, after drilling and cleaning the opposite side, the peelable substrate 108 may be removed to allow for drilling of the side of PCB substrate 104 on which it was originally placed. Where the peelable substrate 108 is used, an appropriate coating and peeling unit is added to the system to enable these operations.

Figure 1D:
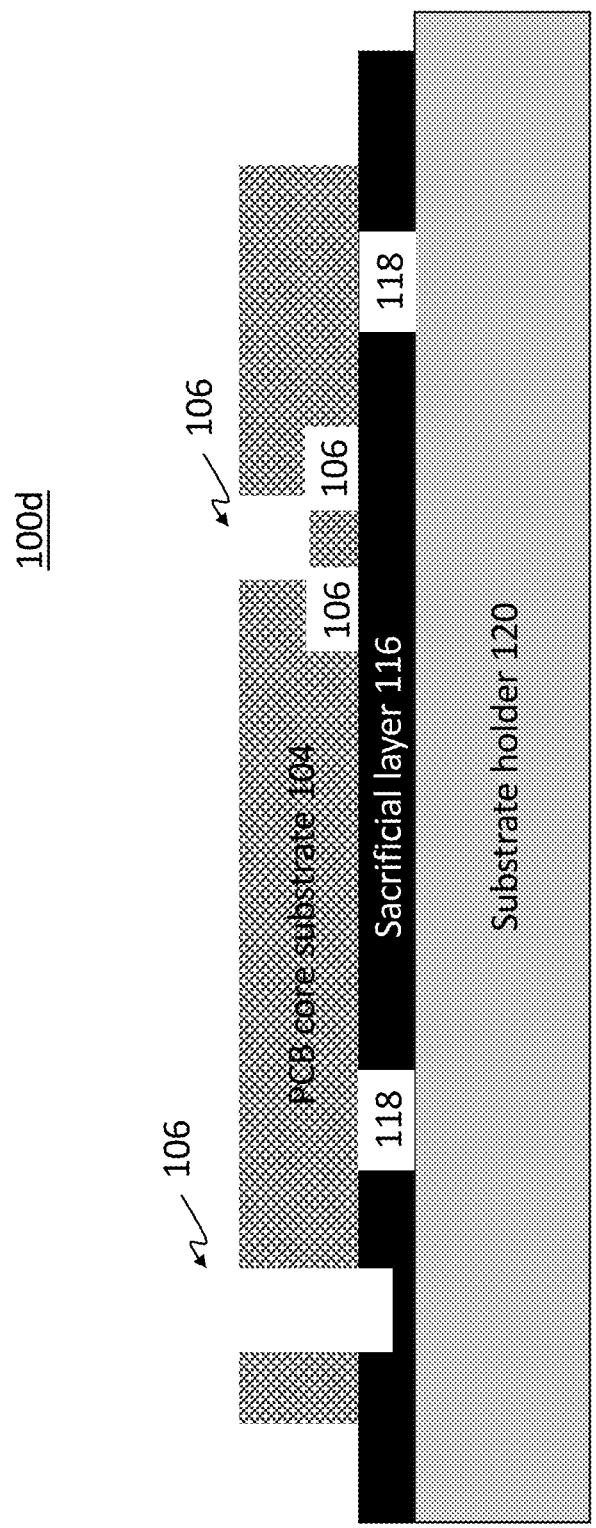

Referring now to FIG. 1d, still another way to keep a sample holder 120 of a PCB board production system 100d clean is to use a sacrificial layer 116 (e.g., made of plastic or a similar material) between the sample holder 120 and the PCB substrate 104. In this case, the sacrificial layer 120 should be able to hold the PCB substrate 104 flat. Typically, the sample holder 120 is a vacuum holder that keeps the PCB substrate 104 flat with the holder surface, but if a sacrificial layer 116 is added it should be able to maintain the vacuum on the PCB substrate 104. Accordingly, some holes 118 must be added in the sacrificial layer 116 so that vacuum is maintained against the PCB substrate 104, and these holes should be located away from the drilling hole 118 positions. For each application, a new sacrificial layer 116 must be designed (to account for the locations of the drilling holes), and it can be used many times.

Figure 2A:
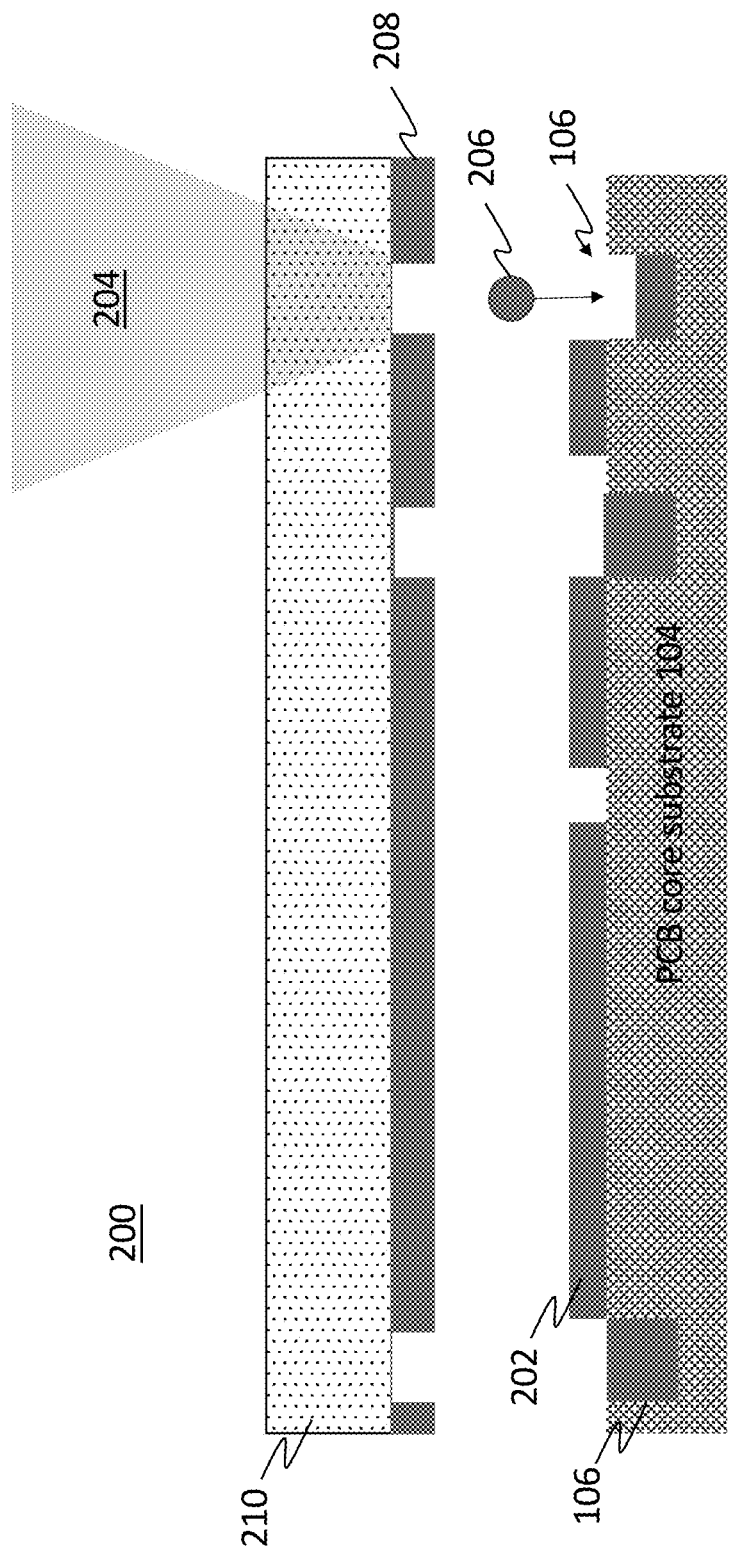
FIGS. 2a-2c illustrate schematically a process of printing a metal layer into a via in accordance with embodiments of the present invention.

Turning now to the metallization process, in embodiments of the present invention this may be performed by paste printing. FIG. 2a illustrates how, in a PCB board production system 200, a non-flat surface, such as a PCB substrate 104 in which vias 106 have been engraved/drilled, is covered by a metal paste 202 by laser induced jetting. Laser induced jetting is a form of LAD in which a laser beam 204 is used to create a patterned surface by controlled material deposition. In particular, laser photons provide the driving force to catapult a small volume of material 206 from a donor film 208 toward an acceptor substrate such as PCB substrate 104. Typically, the laser beam 202 interacts with an inner side of the donor film 208, which is coated onto a non-absorbing carrier substrate 210. The incident laser beam 204, in other words, propagates through the transparent carrier substrate 210 before the photons are absorbed by the inner surface of the film 208. Above a certain energy threshold, material 206 is ejected from the donor film 208 toward the surface of the PCB substrate 104 which is situated on a stage (not shown in this view) in a work area.

Figure 2B:
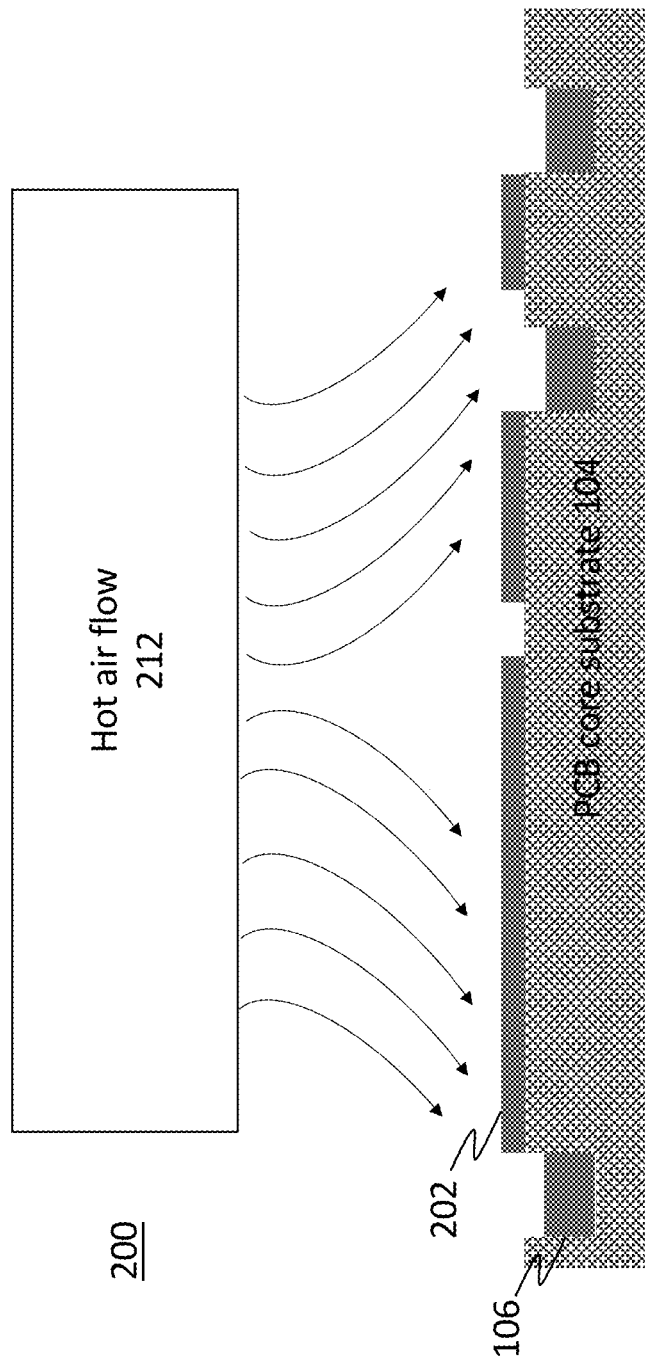
Figure 2C:
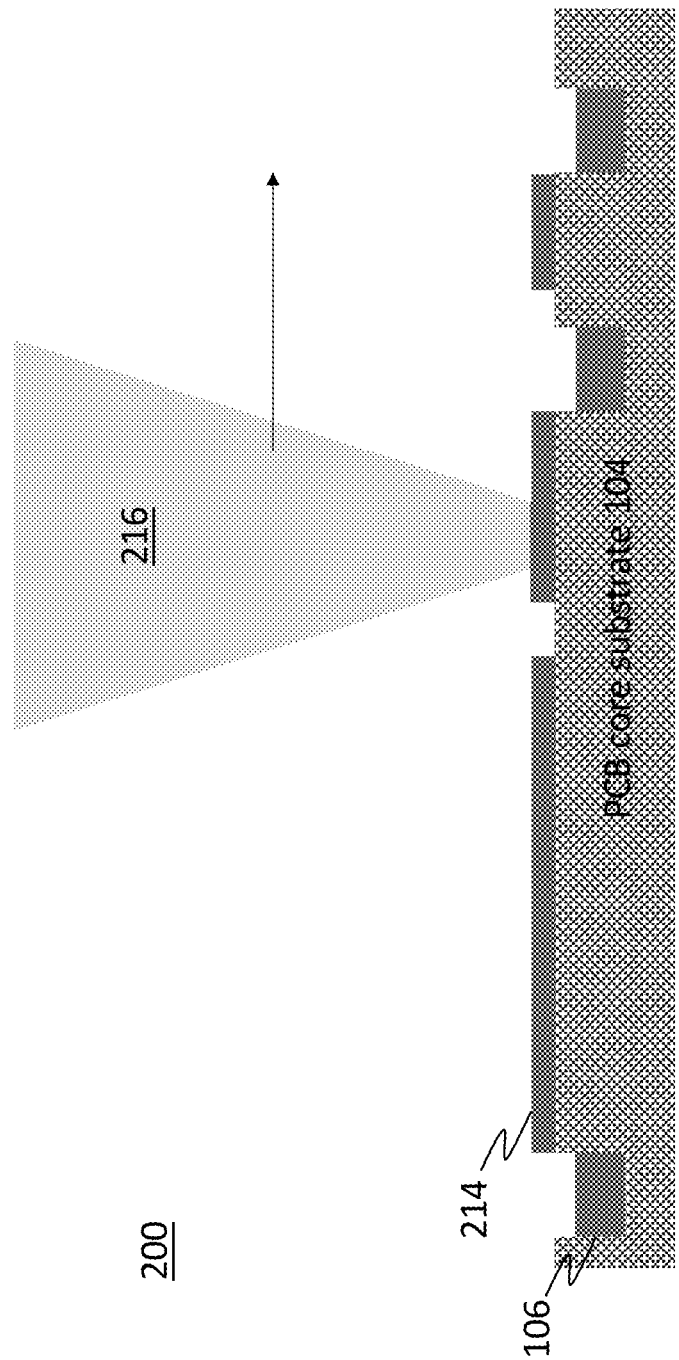

Once deposited on the PCB substrate 104, including in vias 106, the metal paste 202 is dried by hot air 212, see FIG. 2b, or by heating using an infra-red (IR) lamp or similar arrangement and the resulting metal film 214 can be sintered using a laser beam 216 that is passed over the deposited metal paste to produce a highly conductive metal (e.g., copper) film as shown in FIG. 2c. The same laser that was used for the paste deposition may be used for the sintering and can be used also for ablating deposited material that was not placed correctly—an inline repair to increase robustness.

Because the printing of the conductive film is an intermediate step, it is desirable that the formation of this layer does not take a long period of time. Accordingly, the material from which the conductive film is formed should take only a short time to cure (whether by IR irradiation, hot air, or both) and should not shrink much (if at all) during the curing process. Materials that take an excessive time to cure will impede the overall speed of the process, and those that shrink (at least more than a little bit) during curing will impart mechanical stress on the PCB substrate, which may lead to failure.

Figure 2D:
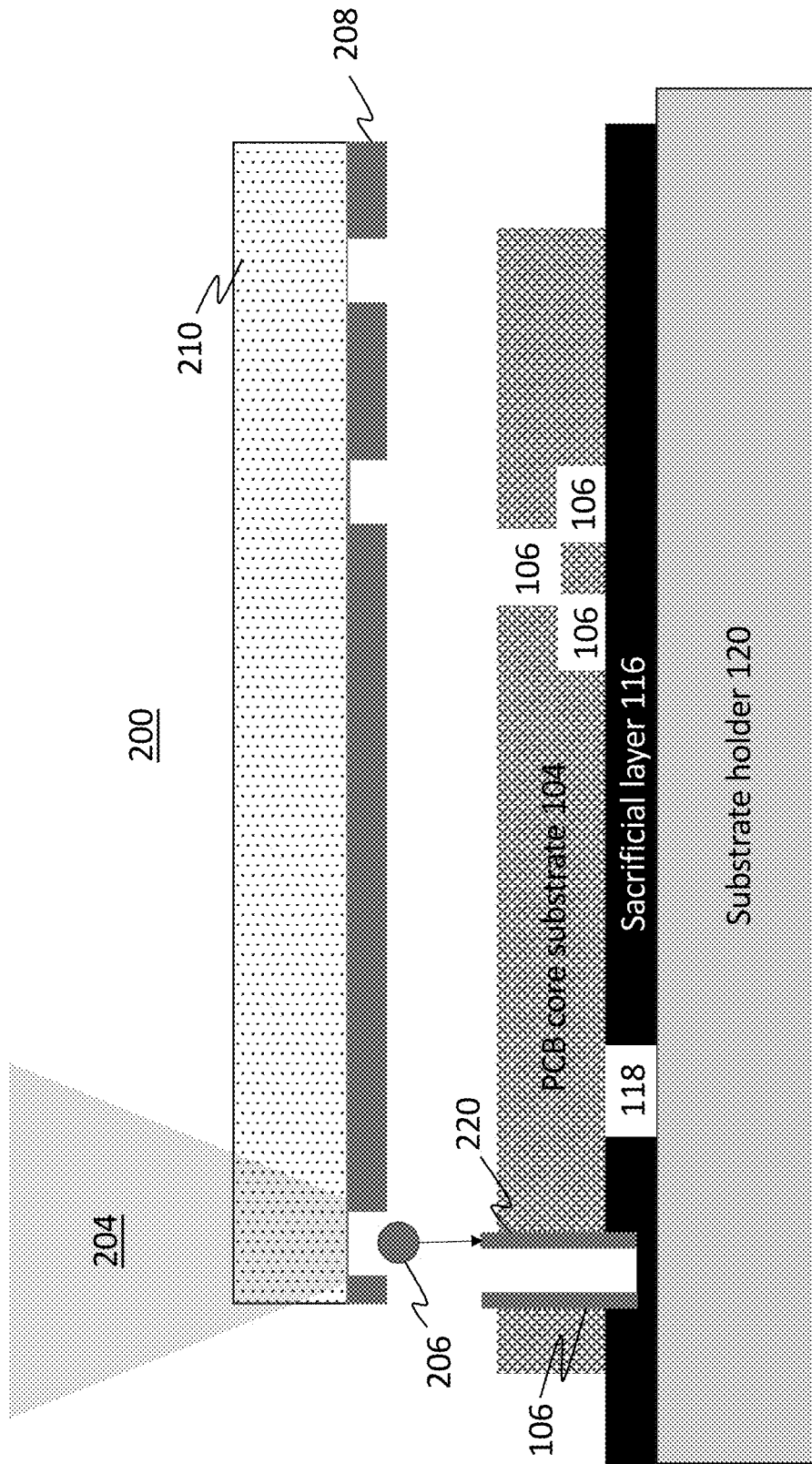
FIG. 2d illustrates one example of printing on the edges of a via to create a metal coat on the via walls in accordance with embodiments of the present invention.

The active or conductive material used for the conductive film may comprise one or more metals. Metals that are contemplated include pure metals, metal alloys, and refractory metals. Copper is a common choice for PCB metallization, and may be used in embodiments of the present invention. The active material may be applied (printed) using LAD either from a solid state, e.g., small metal particles that are deposited on a plastic film can be used in the LAD process to generate a conductive layer, or in the form of a paste carried on a donor film as described above. The conductive film should be applied in an amount sufficient to fully support the subsequent electronic connections. This may mean applying several layers of paste, one atop the other, with curing steps after each application of a layer. As shown in FIG. 2d, the laser jetting process is highly accurate and so can be used to print the metal paste 208 directly on edges 220 of the vias 106, enabling a way to coat only the vias holes and not to fill them. This approach may be of some importance in the case of large and/or deep vias.

Figure 3A:
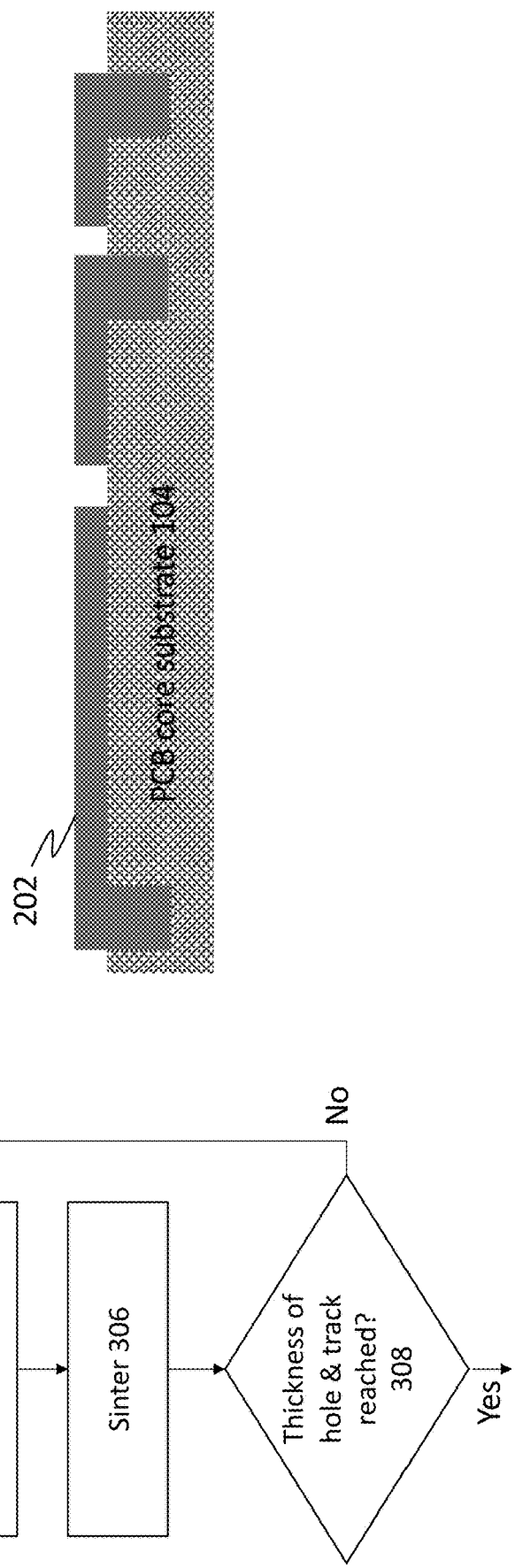
FIGS. 3a and 3b illustrate various alternatives for the metal printing process stages.
Figure 3B:
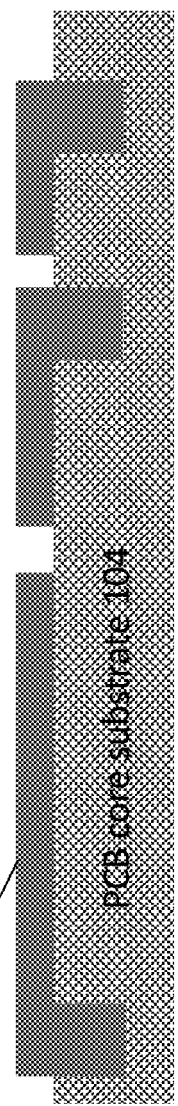
Figure 3B:
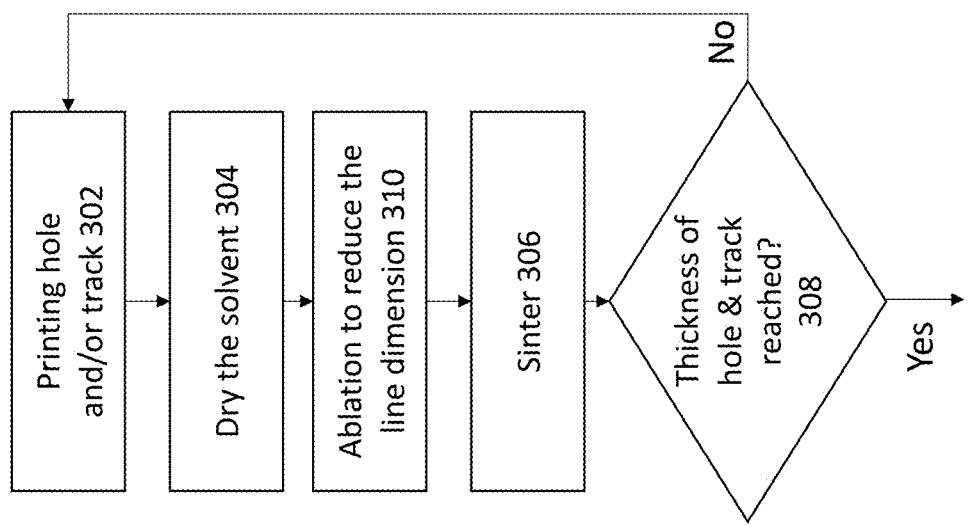

One embodiment of the metallization process is illustrated schematically in FIG. 3a. First, a hole or track is printed (i.e., in the case of a hole, it is filled, and in the case of a track or trace, it is deposited on the PCB substrate or other layer) by laser jetting of a metal (e.g., Cu) (or otherwise) 302, then the solvent is dried 304, and the metal is sintered 306. At this stage, the board can be taken to an imaging unit to verify that the desired hole or track thickness (e.g., in the case of a hole, the fill level) was reached 308. If so, the board is passed to the next stage; otherwise, it is returned for additional printing/deposition and the process repeats until the desired amount of metal has been printed (i.e., a desired thickness reached). As shown in FIG. 3b, in other embodiments an additional ablation step to remove excess deposited material may be added before (or after) the sintering step.

At any layer, after metallization, a dielectric layer may be added to the board to reduce capacitance and avoid short circuits. There are several ways to add the dielectric layer, for example, by coating a liquid material and curing it or by hot pressing of a prepreg. Examples of such processes will now be explained.

Figure 4A:
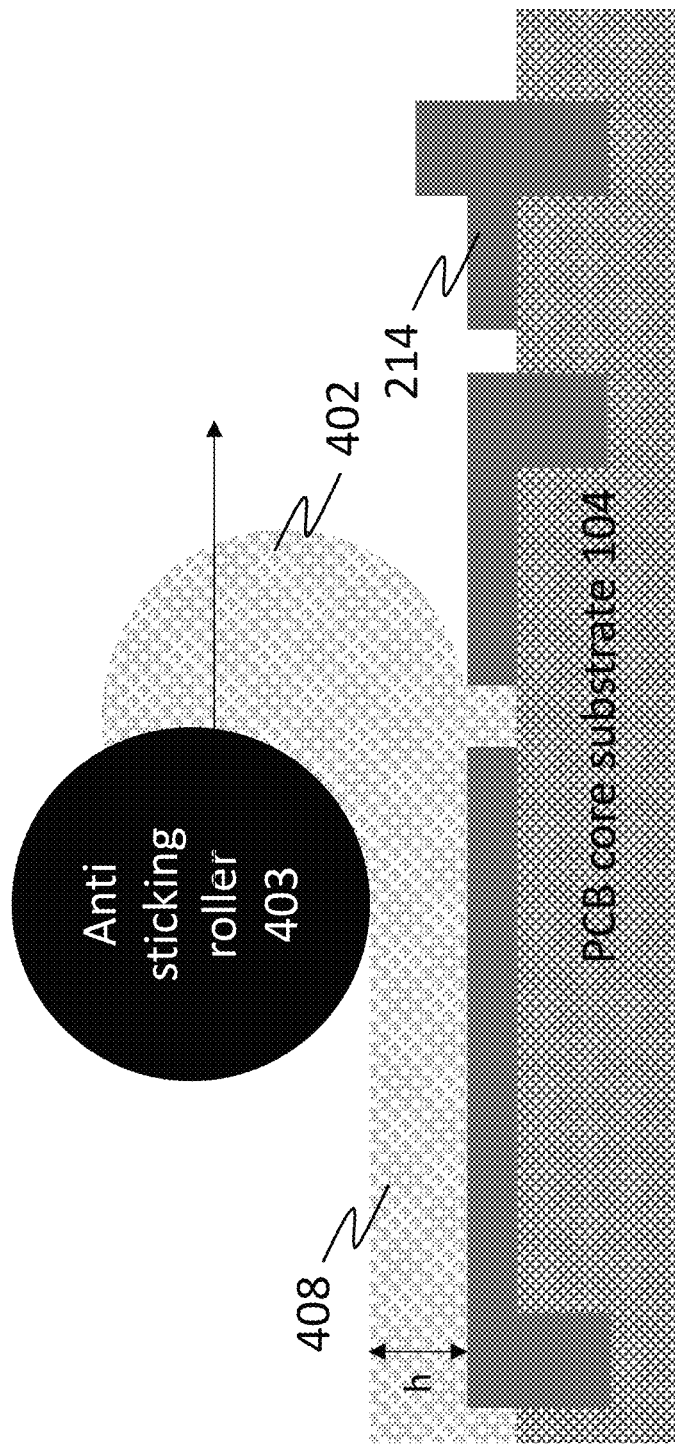
FIGS. 4a and 4b illustrate various ways to print an epoxy layer onto the surface of a PCB, by a roller or blade (FIG. 4a) or by direct printing (FIG. 4b), in accordance with embodiments of the present invention.
Figure 4B:
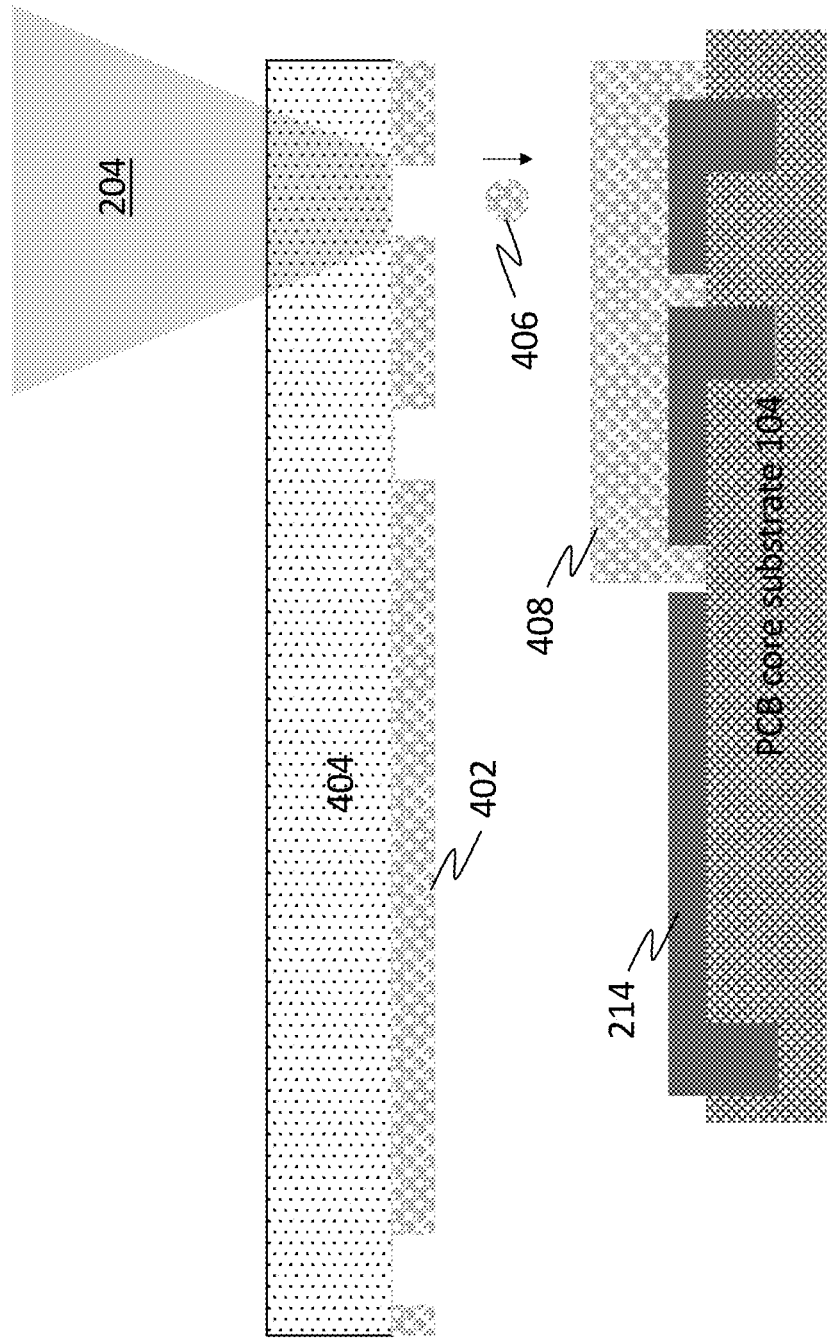

Referring to FIGS. 4a and 4b, a dielectric layer 408, which may be an epoxy and act as a passivation layer, may be deposited or coated over the metal (or other) layer and/or the PCB substrate with the aid of a roller or blade, see FIG. 4a, or by printing the dielectric layer from a donor film using the laser jetting system as shown in FIG. 4b. In the case of coating a liquid epoxy 402 using a roller 403 or blade, the epoxy may be a viscous liquid that includes a filler, such as silica balls. An amount of epoxy 402 is applied to one end of the board and the roller 403, which may be made of or coated with an anti-sticking material such as polytetrafluoroethylene, ceramic, silicone, or other material, is placed at a desired height over the metal layer 214 and moved transversely over the board to spread the epoxy 402 into a layer 408 in a uniform manner at a desired thickness "h". In some cases, the roller 403 may be fixed in position, and the board moved underneath it to cause the epoxy to spread. Where a blade applicator is used instead of a roller, the blade angle with respect to the board will affect the vertical force applied on the epoxy. If the angle is too small, the epoxy may not be squeezed into small apertures between portions of the metal layer. At the same time, if the blade pressure is too small, it may prevent the epoxy from being cleanly applied to the board and if it is too high, it may result in epoxy leakage outside the desired coverage area. Accordingly, adjustment means for the blade angle should be provided and the blade angle adjusted according to the epoxy viscosity and other characteristics.

Alternatively, as shown in FIG. 4b, the epoxy 402 may be applied in a thin layer to a substrate or foil 404, and then deposited in small amounts 406 (e.g., droplets) onto the metal layer 214 and/or PCB substrate 104 by laser jetting using the same laser that produced beam 204 that was also used for jetting the metal layer. The epoxy 402 may be applied to the substrate 404, which is transparent or nearly so at the wavelengths of laser beam 204, by a roller system in which the substrate is passed between a pair of rollers or a single roller and a fixed surface separated by a well-defined gap so as to ensure the resulting coating of epoxy 402 is of uniform thickness. For example, such a coating system may include a syringe of the epoxy and an air or mechanical pump that drives the epoxy onto the substrate 404. The substrate 404 may then be moved towards the well-defined gap to create the uniform layer of epoxy 402 with a thickness that is defined by the gap. In some embodiments of the invention, the substrate 404 can translated bidirectionally in a controlled manner, while opening the gap between the coater rollers, creating the possibility for recoating the same area of the substrate 404 with the epoxy without contamination to the rollers and reducing or eliminating the amount of substrate 404 consumed during the coating process, thereby preventing waste.

Once coated, the substrate 404 with the layer of epoxy 402 thereon is positioned in the laser jetting system and dots 406 of the epoxy 402 are jetted onto the metal layer 214 and/or PCB substrate 104 using laser beam 204. In one example, the laser beam 204 is focused onto the interface between the layer of epoxy 402 and the substrate 404 causing local heating followed by a phase change and high local pressure which drives jetting of the epoxy onto the metal layer and/or PCB substrate. After printing the epoxy to the metal layer and/or PCB substrate, the substrate 404 can be returned for a second (or additional) coating of epoxy 402 by reversing the direction of a transport mechanism or, where substrate 404 is a continuous film, be moving substrate 404 through the coating system in a loop-like process.

In still further embodiments, the substrate 404 may be a screen or grid in which the epoxy 402 is introduced into holes of the screen by a coater, which may be a roller or blade, and the incident laser beam 204 used to displace the epoxy from the holes in the screen onto the metal layer and/or PCB substrate.

Figure 4C:
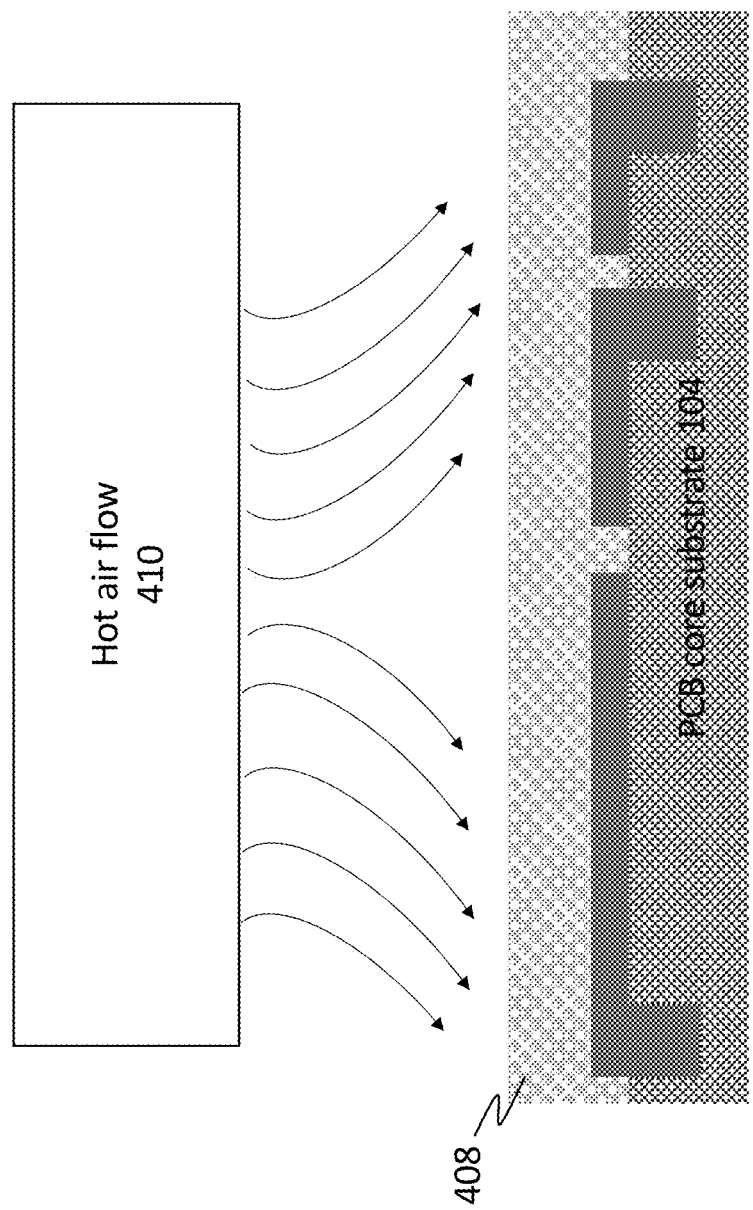
FIG. 4c illustrates the heating of a PCB produced according to the methods illustrated in FIGS. 4a and 4b to achieve the final laminate properties.

Referring to FIG. 4c, after printing or coating the epoxy layer 408, heat is applied to the layer by hot air, IR irradiation, and/or other heating method(s) and the epoxy layer is cured.

Yet another approach for passivation is to use a laminate to create a passivation layer. The use of laminate reduces height differences in a surface and creates a much more uniform height PCB surface. A laminate passivation layer can be formed in either of two different ways: printing the metal (e.g., Cu) onto the laminate and attaching the resulting structure to the surface (FIGS. 5a-5c) or attaching the laminate to the surface of the PCB and printing metal (e.g., Cu) into open vias (FIGS. 6a-6c).

Figure 5B:
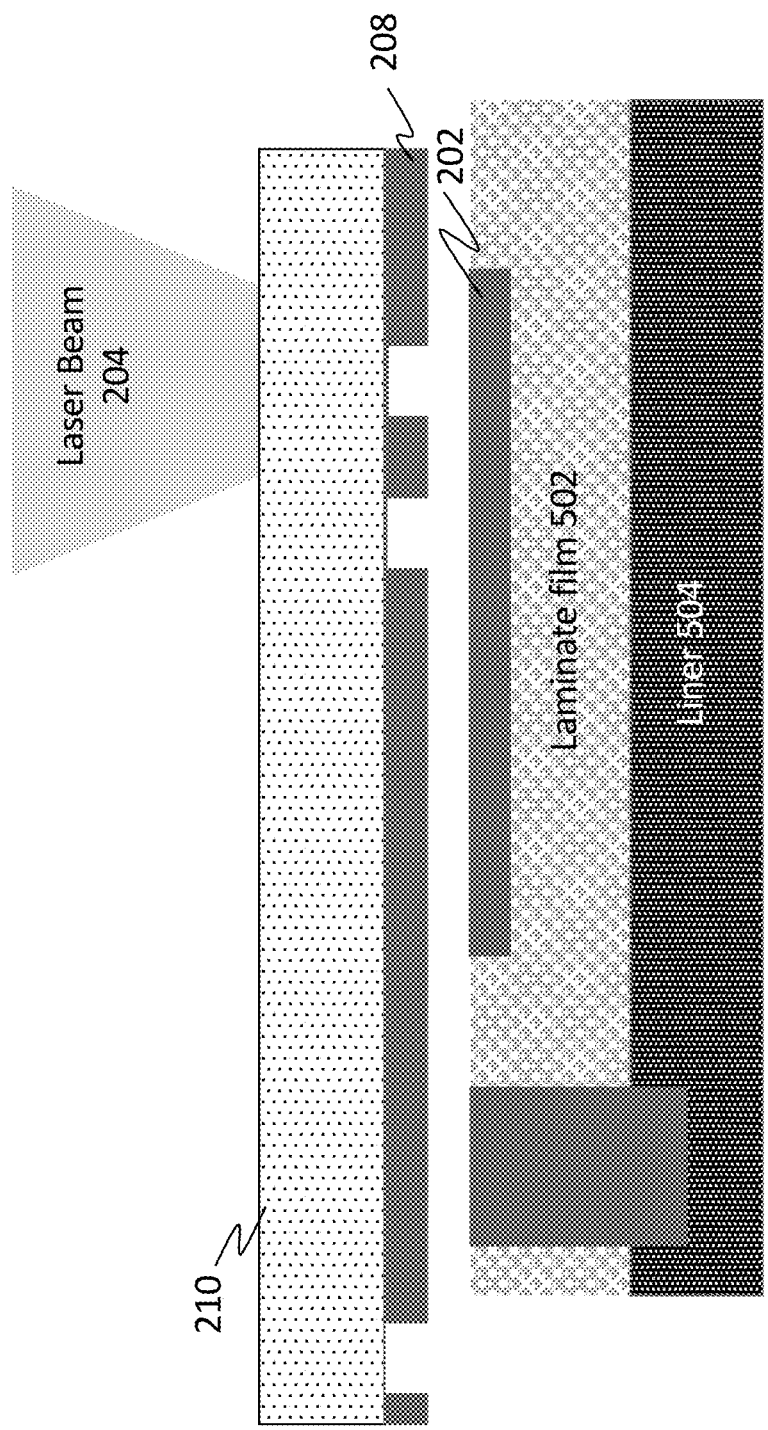
Figure 5C:
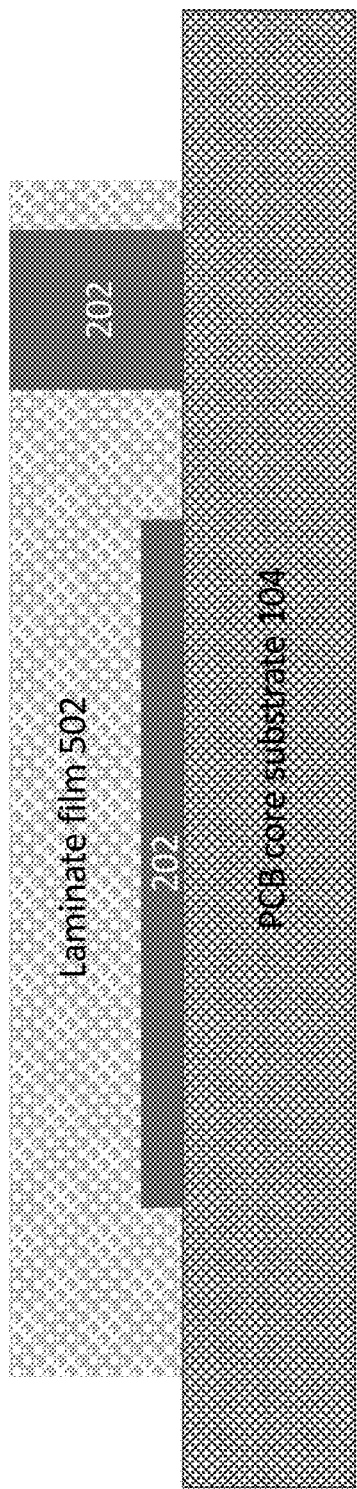

In the first process, and referring to FIGS. 5a-5c, a laminate film 502 is attached to a liner 504 and a laser beam 506 is used to engrave/cut the laminate into a desired configuration, e.g., by creating through holes 508 and/or channels 510 in the laminate. The engraved areas are filled with metal (e.g., Cu) 202 using the laser beam 204 to deposit the metal from a film 208 coated on substrate 210, and only then is the laminate 502 attached (e.g., by hot pressing) to the PCB substrate 104 (or a previously formed laminate layer) to create the layer of both metal and passivation. This approach can enhance the efficiency of the PCB build cycle significantly since the build of the layer and the attachment of the layer can be done as two independent stages, allowing serialization thereof.

Figure 6B:
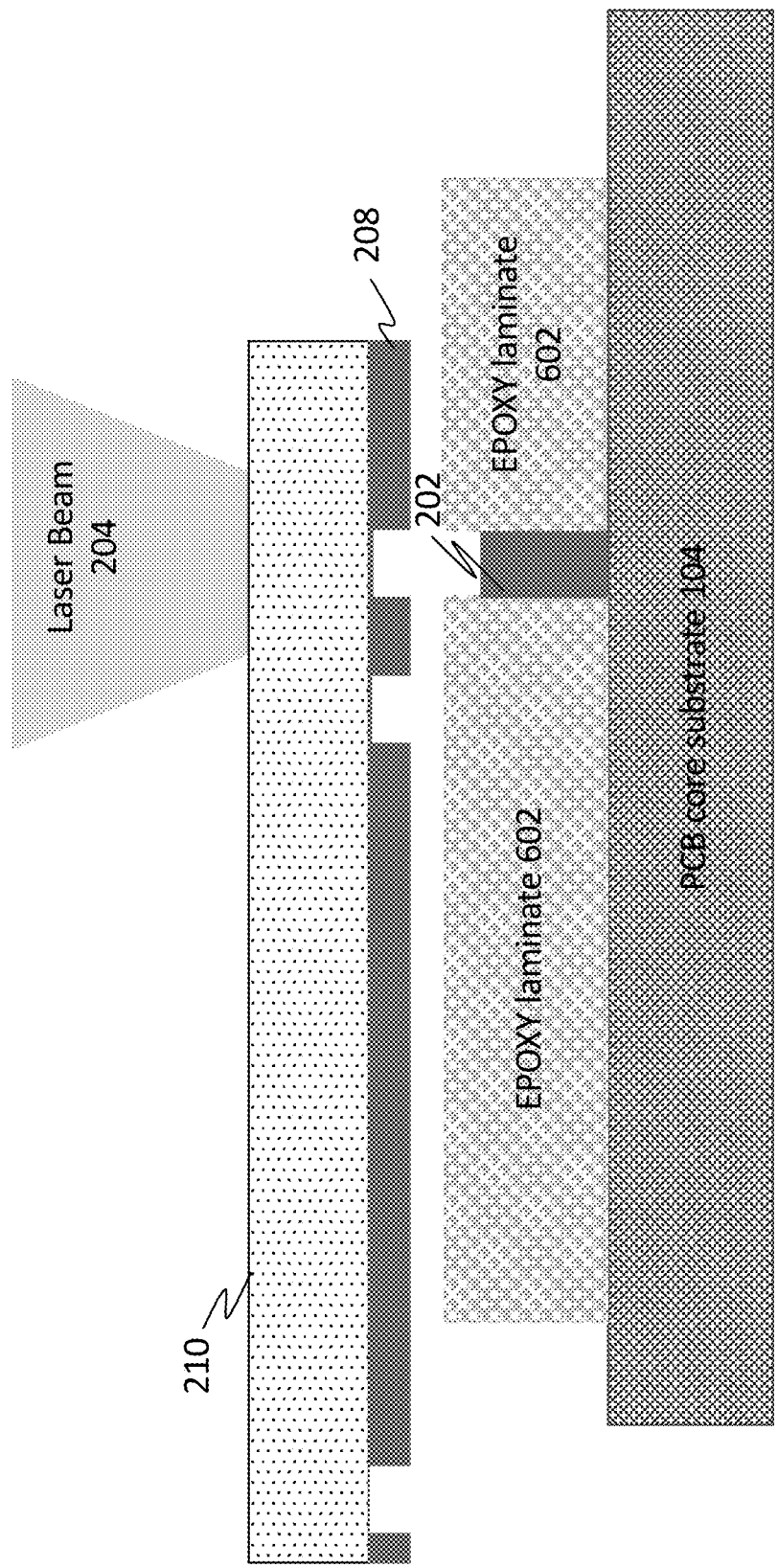
Figure 6C:
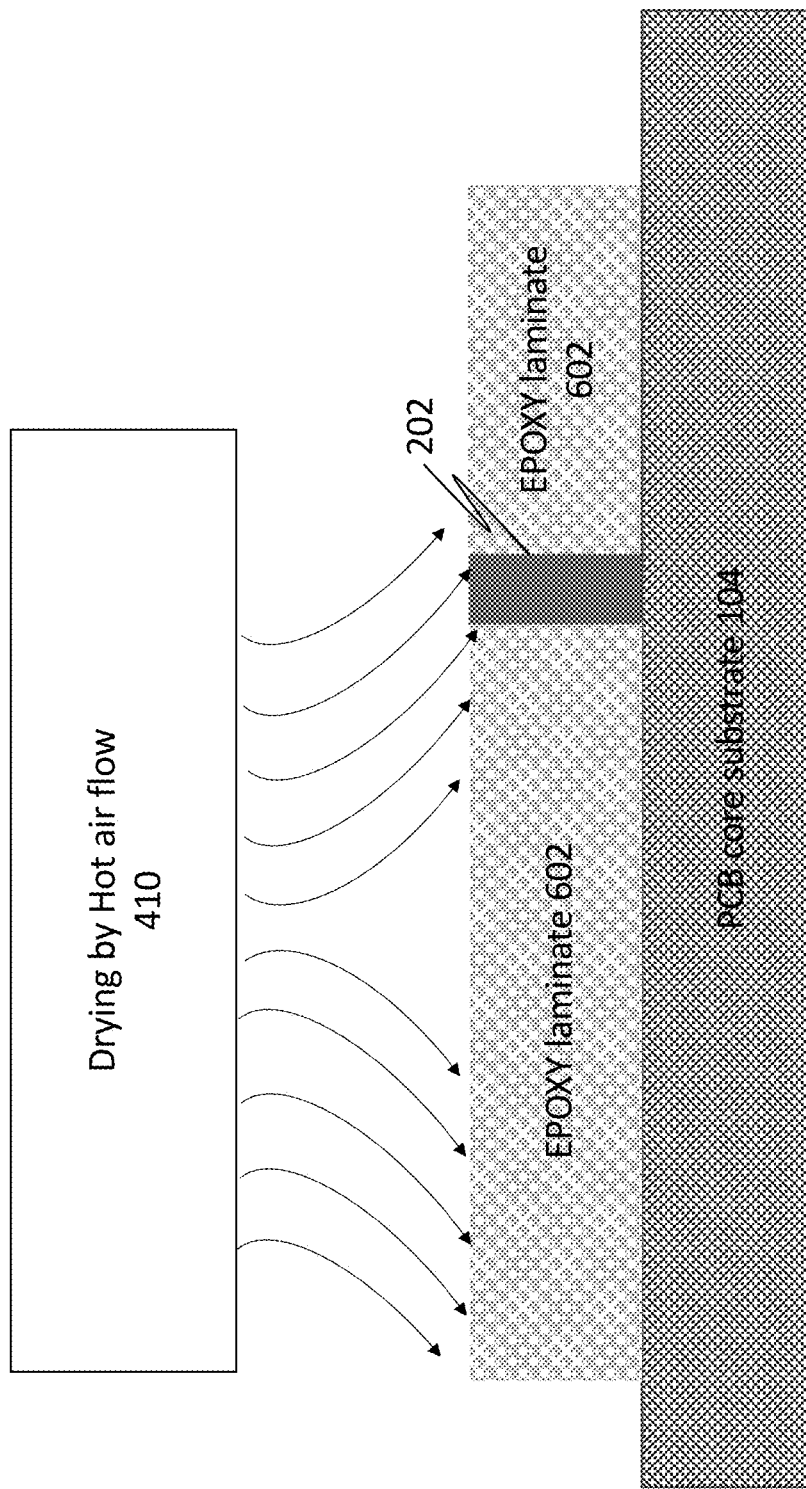

Other advantages can be achieved from attachment of a laminate layer 602 (e.g., an epoxy laminate) to the PCB substrate 104 and subsequently engraving the laminate layer using a laser beam 606, as shown in FIG. 6a. This approach is more stable to thermal effect at the hot pressing stage when the laminate is attached to the PCB substrate. After engraving, the vias and holes are filled with metal in the fashion described above (FIG. 6b) and hot air 410 is applied to the surface of the board to dry the metal (FIG. 6c). Additional laser sintering can be added to enhance the conductivity of the metal particles.

Figure 7A:
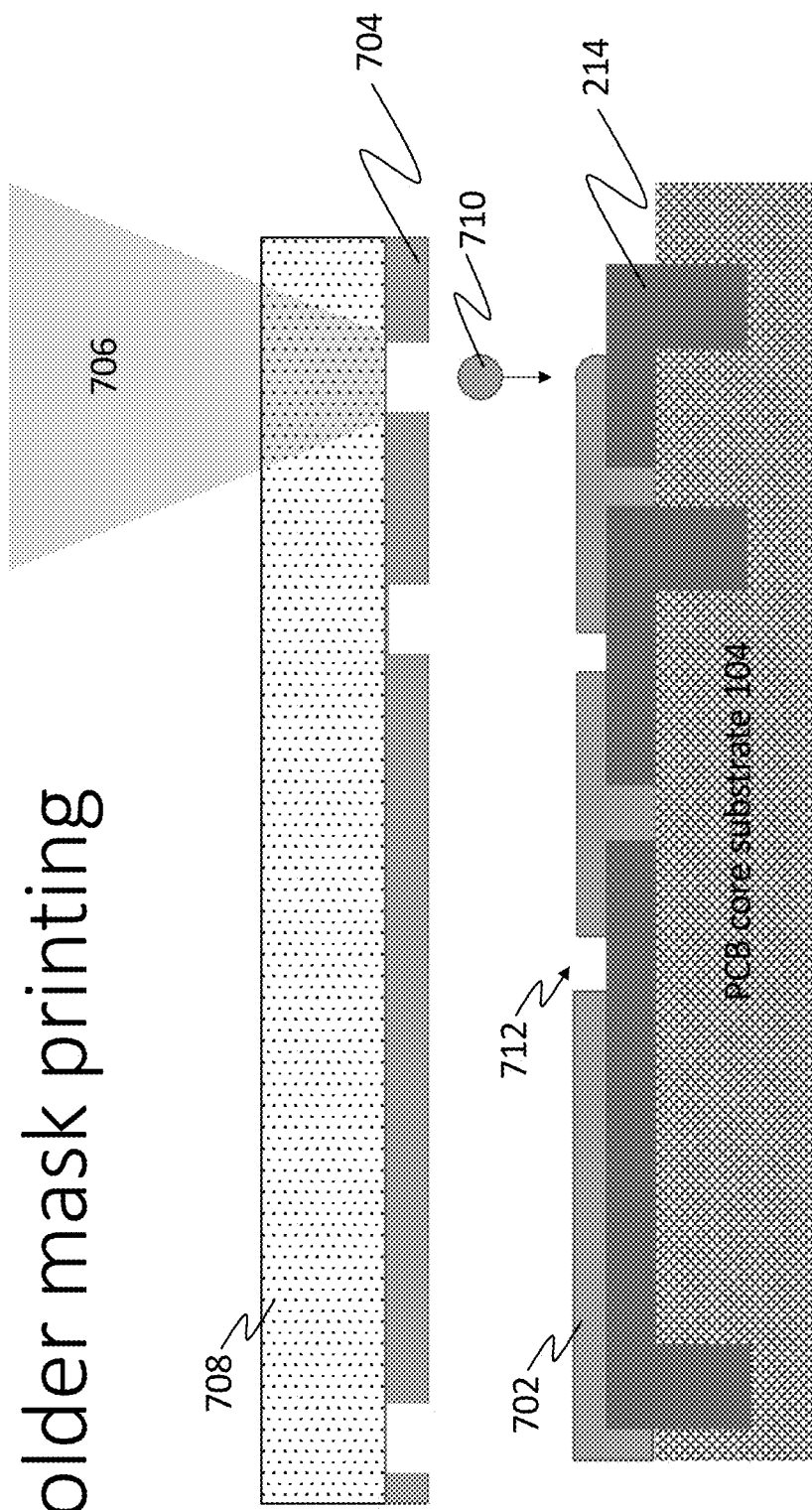
FIGS. 7a-7c illustrate printing of a solder mask onto a PCB (FIGS. 7a-7b) and curing thermally or by UV light (FIG. 7c).

In the final part of the PCB production the board is coated by a layer of solder mask. By acting as a protectant for underlying layers, the solder mask layer enables the soldering of electronic components to the board using high temperature without damaging the board's inner layers. As shown in FIG. 7a, one method for printing a solder mask 702 is by laser jetting. Similar to the manner in which an epoxy layer was printed, the solder mask material 704 may be applied in a thin layer to a substrate or foil 708, and then deposited in small amounts 710 (e.g., droplets) onto the metal layer 214 and/or PCB substrate 104 by laser jetting using a laser beam 706. Laser beam 706 may be produced by the same laser that was also used for jetting the metal layer and/or the epoxy layer. The solder mask material 704 may be applied to the substrate 708, which is transparent or nearly so at the wavelengths of laser beam 706, by a roller system in which the substrate is passed between a pair of rollers or a single roller and a fixed surface separated by a well-defined gap so as to ensure the resulting coating of solder mask material 704 is of uniform thickness. For example, such a coating system may include a syringe of the solder mask material and an air or mechanical pump that drives the solder mask material onto the substrate 708. The substrate 708 may then be moved towards the well-defined gap to create the uniform layer of solder mask material 704 with a thickness that is defined by the gap. In some embodiments of the invention, the substrate 708 can translated bidirectionally in a controlled manner, while opening the gap between the coater rollers, creating the possibility for recoating the same area of the substrate 708 with the solder mask material without contamination to the rollers and reducing or eliminating the amount of substrate 708 consumed during the coating process, thereby preventing waste.

Once coated, the substrate 708 with the layer of solder mask material 704 thereon is positioned in the laser jetting system and dots 710 of the solder mask material 704 are jetted onto the metal layer 214 and/or PCB substrate 104 using laser beam 706. In one example, the laser beam 706 is focused onto the interface between the layer of solder mask material 704 and the substrate 708 causing local heating followed by a phase change and high local pressure which drives jetting of the solder mask material onto the metal layer and/or PCB substrate. After printing the solder mask 702 to the metal layer and/or PCB substrate, the substrate 708 can be returned for a second (or additional) coating of solder mask material 704 by reversing the direction of a transport mechanism or, where substrate 708 is a continuous film, be moving substrate 708 through the coating system in a loop-like process.

Figure 7B:
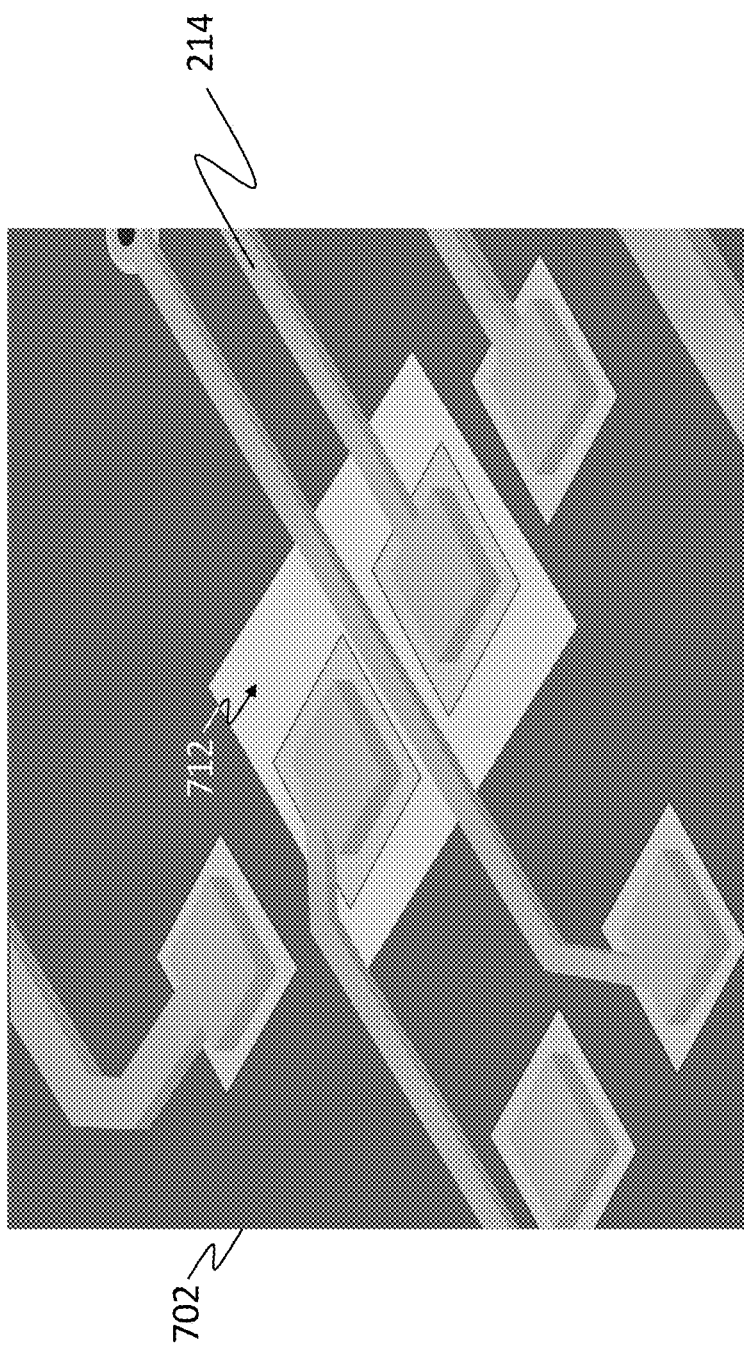
Figure 7C:
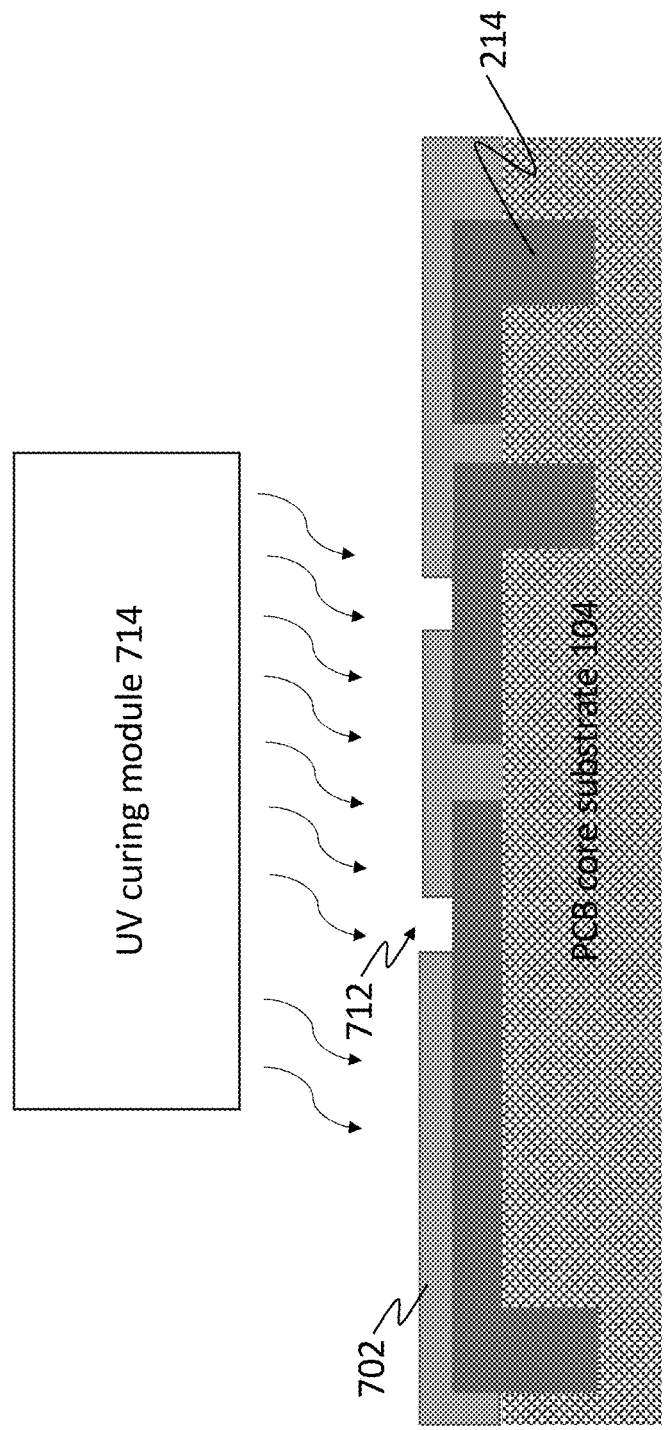

Once the solder mask 702 has been printed, see FIG. 7b, it is cured, as shown in FIG. 7c, using UV light 714 and/or heat to create a mask layer that is open only in the soldering areas 712.

It is often useful to have a label on top of the PCB board to help a technician understand the purpose of each component and to point the technician to areas on the PCB board. To that end, an additional label layer 802 may be added on top of the solder mask layer 702. The label layer 802 can be printed by inkjet, screen printing, or other printing methods, and in one embodiment it is printed by the same laser jetting system used for printing the solder mask layer.

Figure 8A:
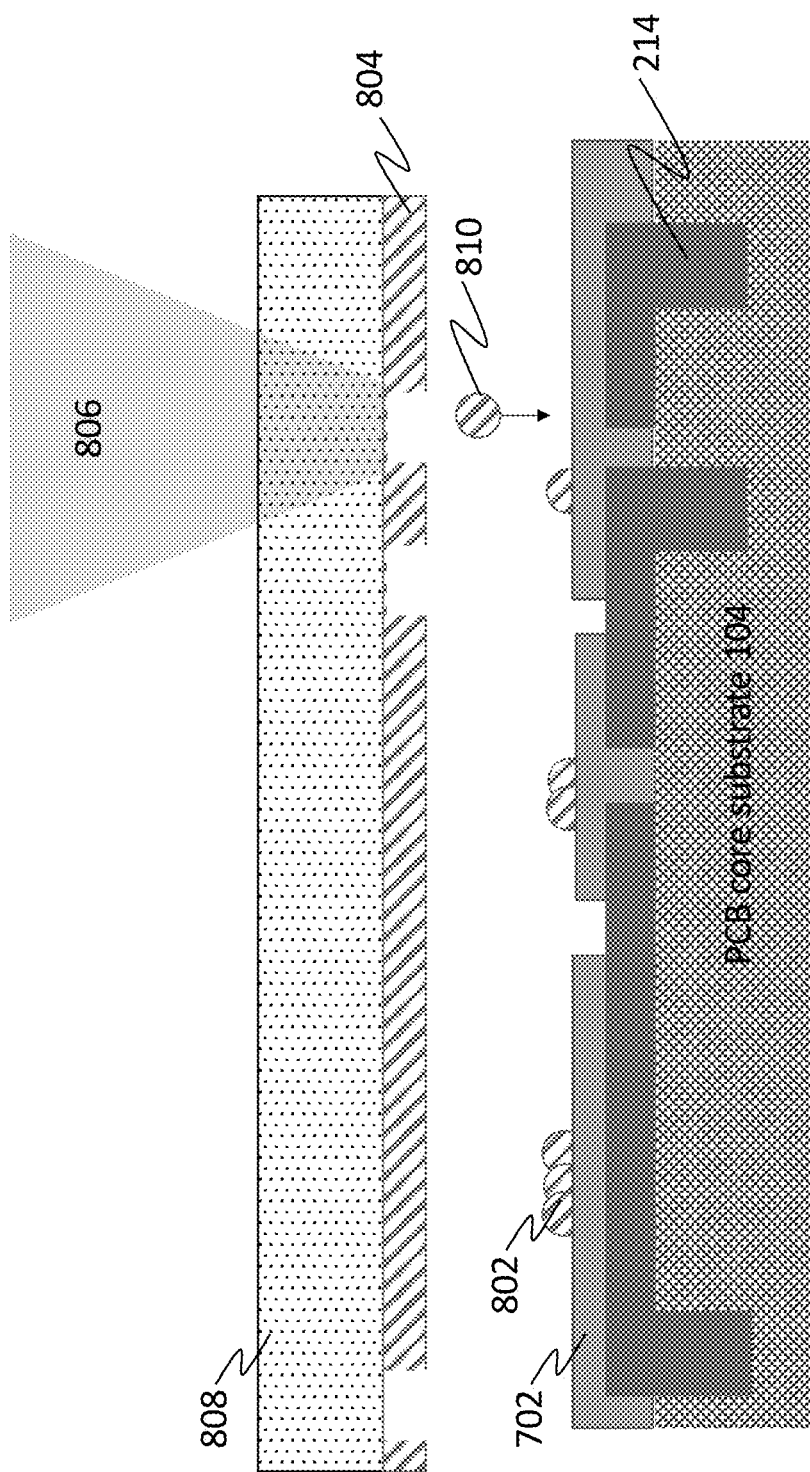
FIGS. 8a and 8b illustrate printing of a label onto a PCB (FIG. 8a) and curing thermally or by UV light (FIG. 8b).

As shown in FIG. 8a, the label material 804 may be applied in a thin layer to a substrate or foil 808, and then deposited in small amounts 810 (e.g., droplets) onto the solder mask layer 702 by laser jetting using a laser beam 806. Laser beam 806 may be produced by the same laser that was also used for jetting the metal layer, epoxy layer, and/or solder mask layer. The label material 804 may be applied to the substrate 808, which is transparent or nearly so at the wavelengths of laser beam 806, by a roller system in which the substrate is passed between a pair of rollers or a single roller and a fixed surface separated by a well-defined gap so as to ensure the resulting coating of label material 804 is of uniform thickness. For example, such a coating system may include a syringe of the label material and an air or mechanical pump that drives the label material onto the substrate 808. The substrate 808 may then be moved towards the well-defined gap to create the uniform layer of label material 804 with a thickness that is defined by the gap. In some embodiments of the invention, the substrate 808 can translated bidirectionally in a controlled manner, while opening the gap between the coater rollers, creating the possibility for recoating the same area of the substrate 808 with the label material without contamination to the rollers and reducing or eliminating the amount of substrate 808 consumed during the coating process, thereby preventing waste.

Once coated, the substrate 808 with the layer of label material 804 thereon is positioned in the laser jetting system and dots 810 of the label material 804 are jetted onto the solder mask layer 702 using laser beam 806. In one example, the laser beam 806 is focused onto the interface between the layer of label material 804 and the substrate 808 causing local heating followed by a phase change and high local pressure which drives jetting of the label material onto the solder mask layer 702. After printing the label layer 802, the substrate 808 can be returned for a second (or additional) coating of label material 804 by reversing the direction of a transport mechanism or, where substrate 808 is a continuous film, be moving substrate 808 through the coating system in a loop-like process.

Figure 8B:
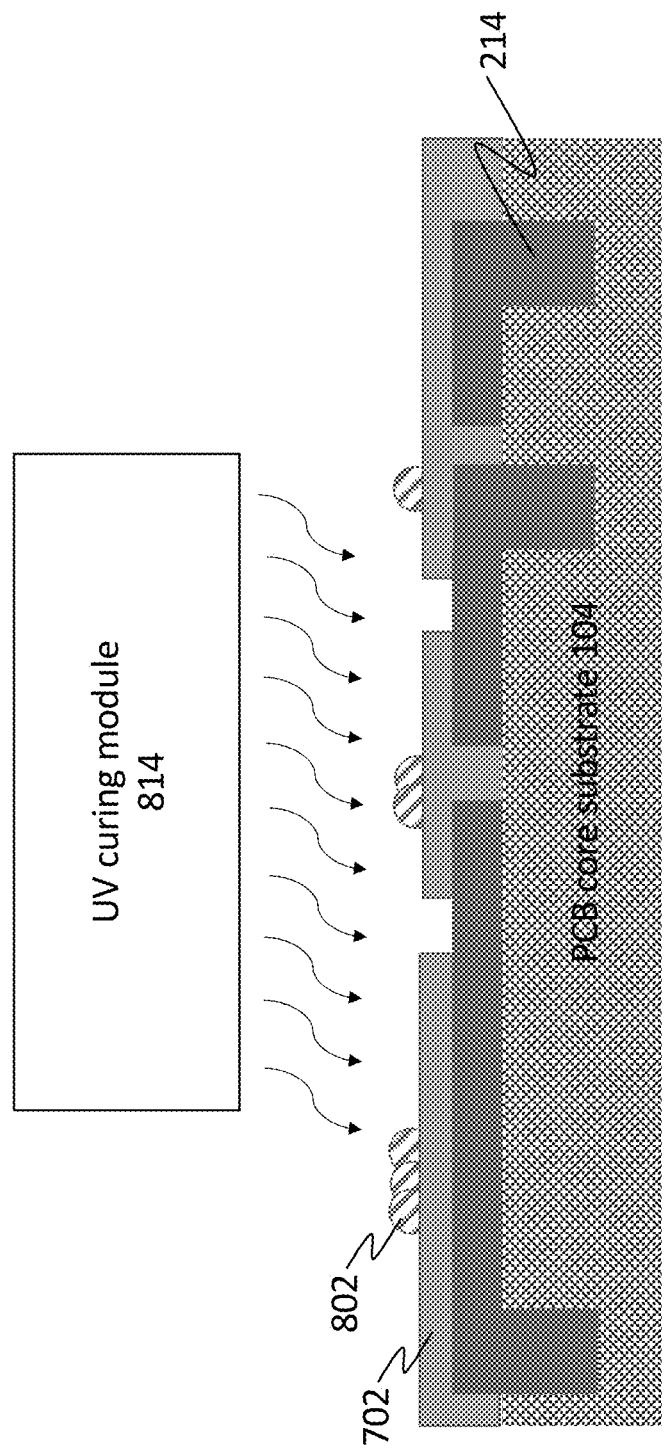

Once the label layer 802 has been printed, it is cured, as shown in FIG. 8b, using UV light 814 and/or heat. The curing station may be the same one used for curing the solder mask layer.

One of the advantages of a PCB production system configured in accordance with embodiments of the invention is its ability to reduce the costs and production times associated with multi-layer PCB boards. Current productions processes for boards that use more than one metal layer are complex. The present invention offers systems and methods incorporate a wide range of applications that allow for straightforward and fast productions of boards with more than one metal layer. For example, while conventional PCB production processes do not accommodate the fabrications of a simple bridge between metal lines, such a bridge is something that can be very easily done in systems configured in accordance with the invention.

Figure 9A:
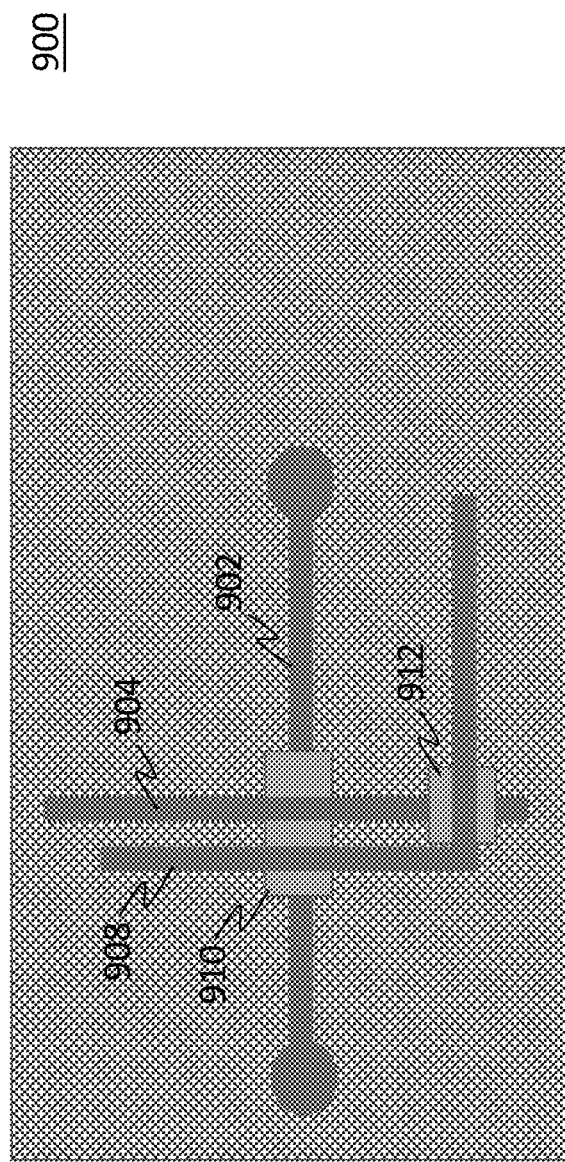
FIGS. 9a and 9b illustrates aspects of how the methods and systems of the present invention can eliminate the need for a double-sided PCB by using epoxy bridges on a single side of a PCB, thereby reducing PCB processing time.
Figure 9B:
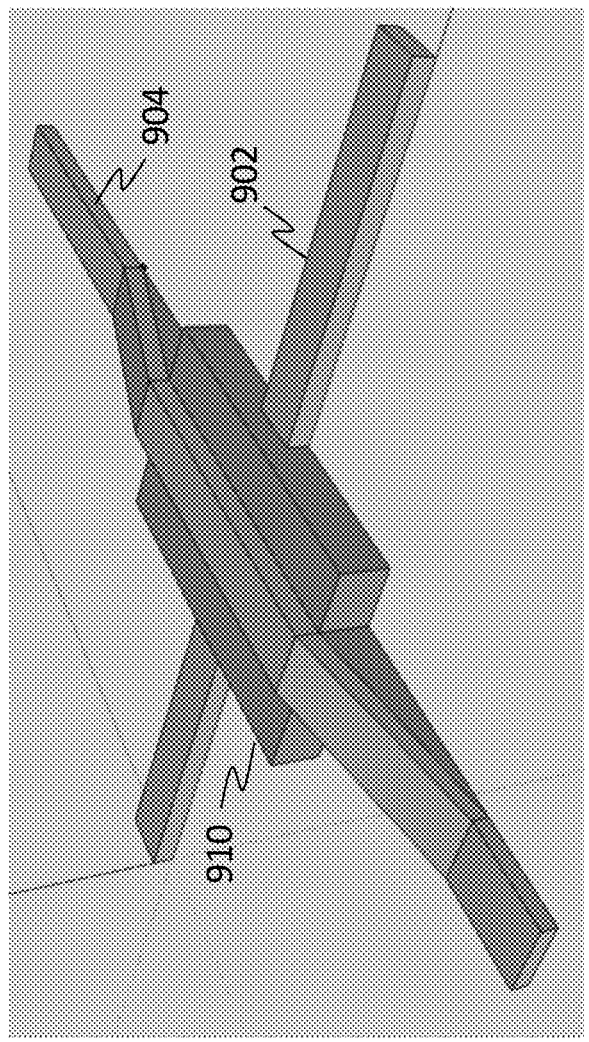

FIG. 9a illustrates an example of a PCB 900 that includes crossed metal (e.g., Cu) lines 902, 904, 906. Using conventional PCB production processes, fashioning PCB 900, if even possible, would entail several productions stages, consuming significant production time. It may even require the use of a double-sided PCB. In a PCB production system employing the methods of the present invention, however, production complexity and time are significantly reduced. For example, using one or more of the above-described techniques, epoxy patches 910, 912 may be printed using laser jetting, allowing the printing of metal lines 902, 904, 906 on a single side of PCB 900 and, optionally, using the same laser jetting apparatus as is used to print the epoxy patches. FIG. 9b provides a close-up three-dimensional view of one of the wire crossings on PCB 900 illustrated in FIG. 9a. After printing metal line 902, the epoxy patch 910 can be printed so that subsequent metal line 904 passes over line 902 on the same side of PCB 900, without creating a short circuit. This simple example illustrates how complex double-sided boards of the past can be fashioned in a relatively straightforward manner using the laser jetting techniques for different materials as discussed above. Of course, the present systems and methods may also be used to fashion double-sided PCBs, with or without bridging structures such as epoxy patch 910, thereby facilitating the production of single and double-sided boards, with bridged and non-bridged areas.

Figure 10A:
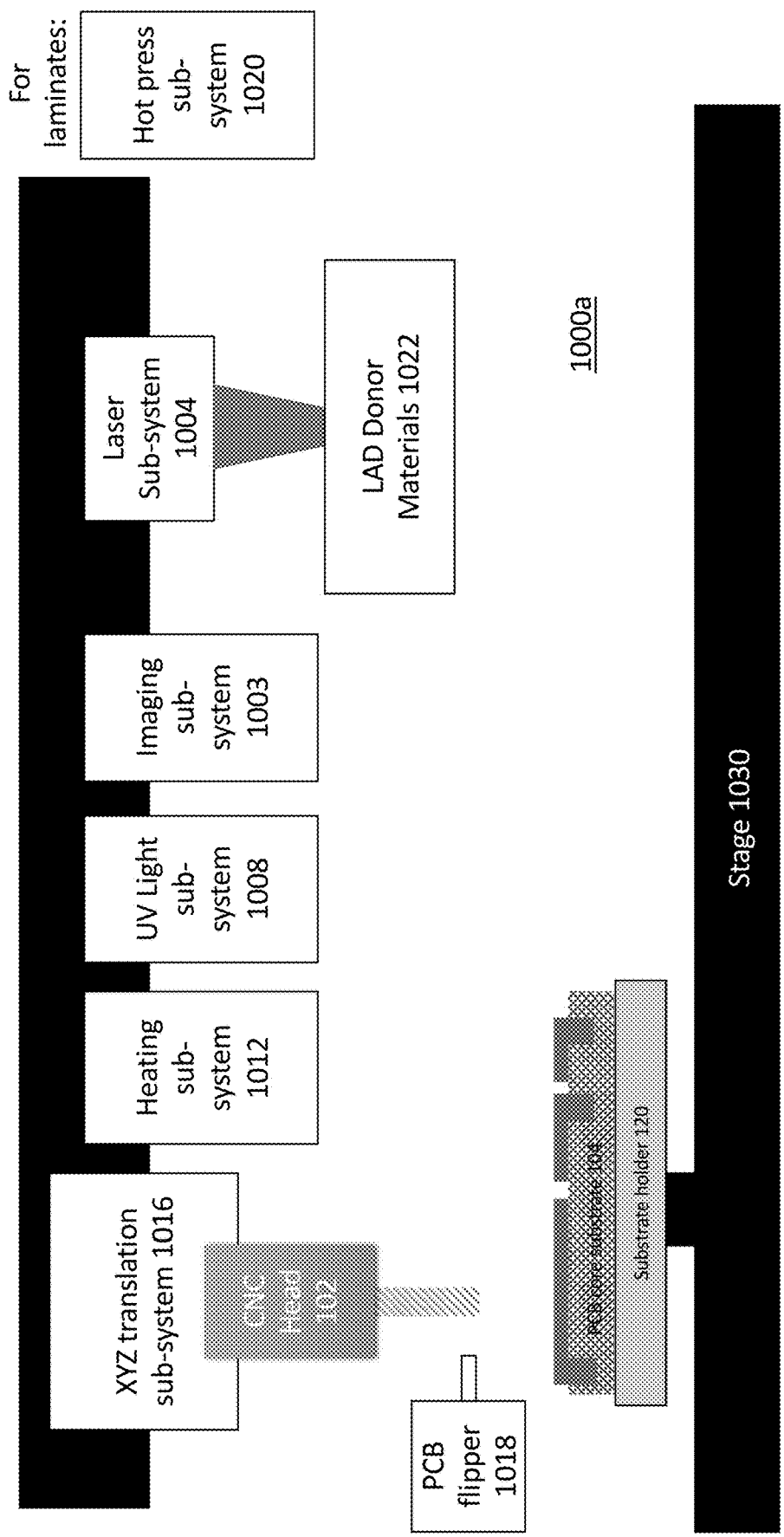
FIGS. 10a and 10b illustrate aspects of a system for full production of PCBs in accordance with embodiments of the present invention.
Figure 10B:
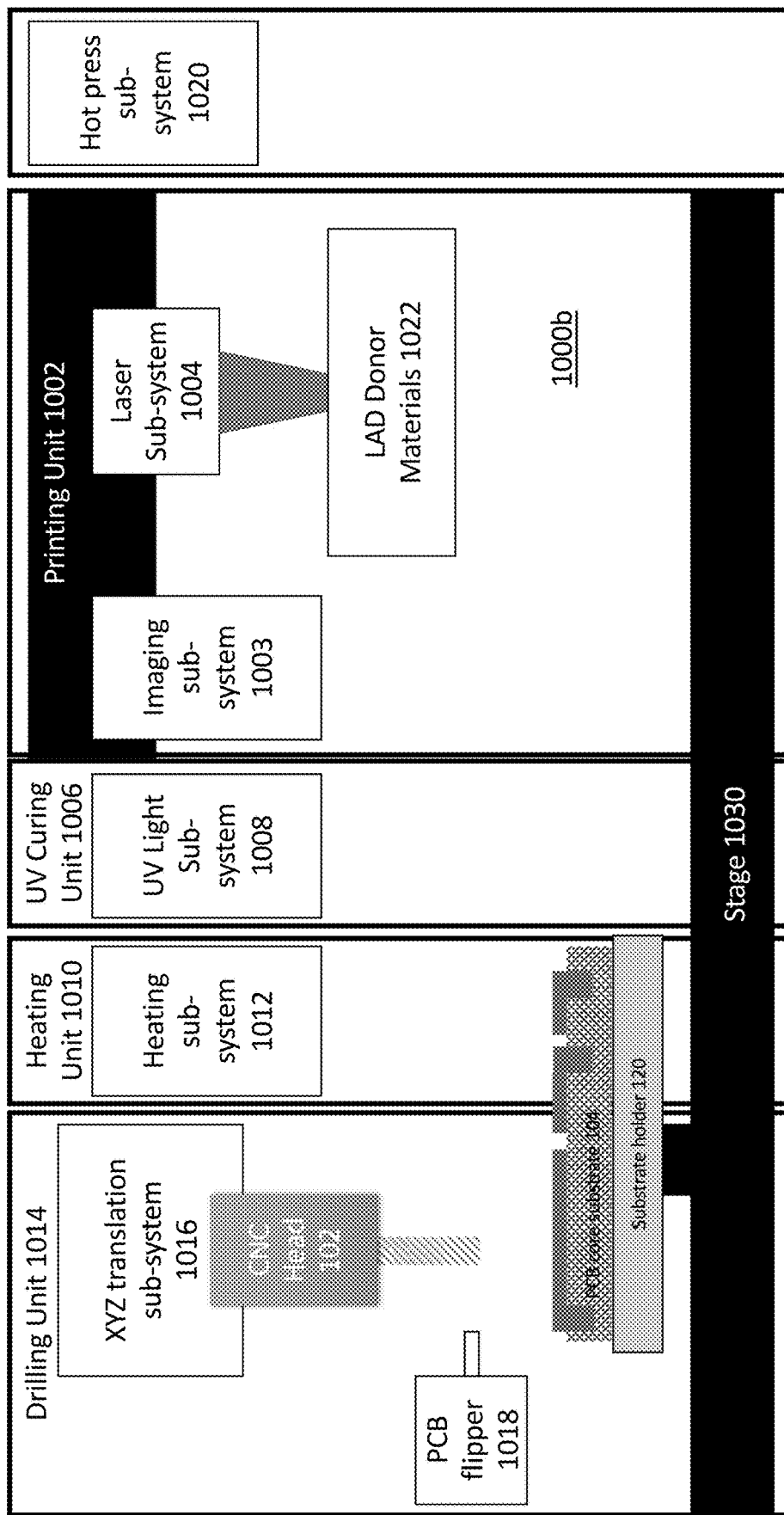

Turning now to FIGS. 10a and 10b, examples of a PCB processing systems 1000a and 1000b configured in accordance with embodiments of the present invention are illustrated. FIG. 10a illustrates system 1000a, composed of individual sub-units, while FIG. 10b illustrates system 1000b, in which the sub-systems are arranged into various modules. In these example, PCB processing systems 1000a and 1000b include an imaging sub-system 1003 and a laser sub-system 1004, which together may be organized into a printing unit 1002. A UV light sub-system 1008 may be included in a UV curing unit 1006, although this is an optional component. A heating sub-system 1012 may be a component of a heating unit 1010. Further, a drilling unit 1014, which includes the CNC drilling head 102 described above and a three-dimensional translation sub-system 1016 for maneuvering the drilling head may be provided as a module, or the components provided separately. Optionally included in the drilling unit 1014 or elsewhere may be a PCB flipping sub-system 1018 which is configured to flip the PCB during processing so as to allow for drilling, printing, etc. on both sides of the PCB. Where laminates are used, an optional hot press sub-system 1020 is available. Associated provided with the printing unit 1002 are various materials 1022 for the LAD procedures discussed above. These include the metal used for conductive traces (e.g., Cu), solder mask material, epoxy(ies), etc. as well as the donor substrate(s) on which these materials are coated for deposition onto the PCB. Although not shown in the diagrams, while the printing unit 1002 can include only a laser sub-system that is for all the laser deposition processes, it may also include an inkjet head or screen printer for printing labels or solder mask materials.

Although not discussed in detail above, imaging sub-system 1003 may be employed in connection with any or all of the above-described etching and deposition procedures. For example, the imaging sub-system may include one or more two-dimensional and/or three-dimensional imaging units (e.g., cameras, scanning laser arrangements, etc.) that image the PCB or portions thereof at various stages during the production process. Vias and holes or features may be imaged so as to ensure they are free from debris and regular in shape. Deposited layers may be imaged so as to ensure they are uniform in coverage and/or accurately positioned.

This may be especially important where layers are printed through successive jetting of small droplets of material. The imaging may also be used to ensure accurate registration of the PCB substrate 102 on a holder 120. Imaging in this fashion can allow for in-line repair of a process step, such as additional or re-coating of a layer, or rejection of an in-process PCB when necessary. Stage 1030 which can translate in two dimensions and, where necessary, raise and lowed PCB 102, facilitates movement of the PCB between the various units of system 1000 and the sub-systems within those units during processing.

As mentioned, the UV light sub-system 1008, whether modularized or not, is optional. As all of the deposited layers can be heat-cured, the use of UV curing is not mandatory, hence, the need for the UV light sub-system is only in cases where UV curing is preferred. When modularized, the UV light sub-system 1008 can be included in the overall system or removed therefrom as desired.

The heating sub-system 1012 is used for curing heat sensitive materials and/or for drying solvent base materials. It can be a part of an overall system 1000a, but it preferably is modularized 1010 so that it can be easily replaced, if necessary, in a system 1000b.

The drilling unit 1014 is used to create holes and vias in the laminates as discussed above. As previously noted, the drilling unit 1014 can be a CNC head 102, or a laser based cutting and engraving unit or a combination of both. While the CNC head and/or laser cutting tool can be incorporated in a larger system such as 1000a, it is preferable that a modular drilling unit 1014 be used so as to compartmentalize the debris generated during the drilling process. After drilling a cleaning procedure is applied to the PCB board either by adding a protective film prior to drilling, by cleaning the surface with air pressure and suction, or by another cleaning process.

In cases where a solid laminate is used as a base for the PCB, the additional hot press sub-system 1020 is used for attachment of the laminate to the PCB substrate 104.

FIGS. 11a-11g illustrate aspects of a production cycle of a single-sided, multilayer PCB, and FIGS. 12a-12d illustrate aspects of a production cycle of a double-sided, multilayer PCB, each from substrate to a final board in accordance with embodiments of the present invention. Beginning with the single-sided, multilayer PCB 1100 illustrated in FIG. 11a, the PCB substrate 1102 may be an FR4 board or a flexible board. A first copper (or other) cladding layer 1104 is formed on top of PCB substrate 1102, and is covered by an epoxy layer 1106. One or more through holes 1114 may be proved in the epoxy layer 1106a to electrically connect copper cladding layer 1104 to a second copper (or other metal) structured layer 1108 disposed on the upper side of epoxy layer 1106a. The through holes may be formed by a drilling process and copper or other metal connectors deposited therein as described above. The upper copper structured layer 1108 is also covered by an epoxy layer 1106b. This structure may be repeated for as many copper (or other metal) layers as are needed, with through holes 1116 having copper or other metal connectors provided as required. Ultimately, the top-most copper layer is covered by a solder mask layer 1110 and gold, silver, or other metal connectors 1112 may be added to allow electrical connections to the various copper lines 1104, 1108 via the metalized through holes 1116, 1114. Gold, silver, or other metal connectors 1112 enable the soldering of electrical components to the PCB board. Examples of processes for forming the single-sided, multilayer PCB 1100 and components thereof will be discussed with reference to FIGS. 11b-11g.

Figure 11A:
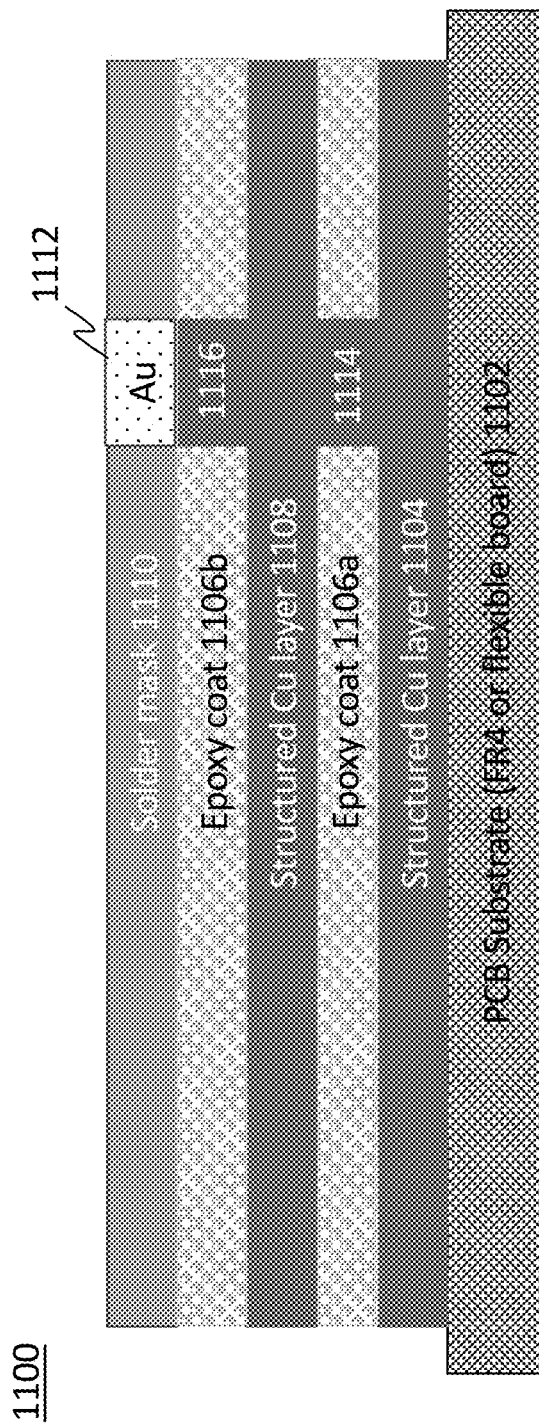
FIGS. 11a-11g illustrate aspects of a production cycle of a multilayer PCB, from substrate to a final board, in accordance with embodiments of the present invention.
Figure 11B:
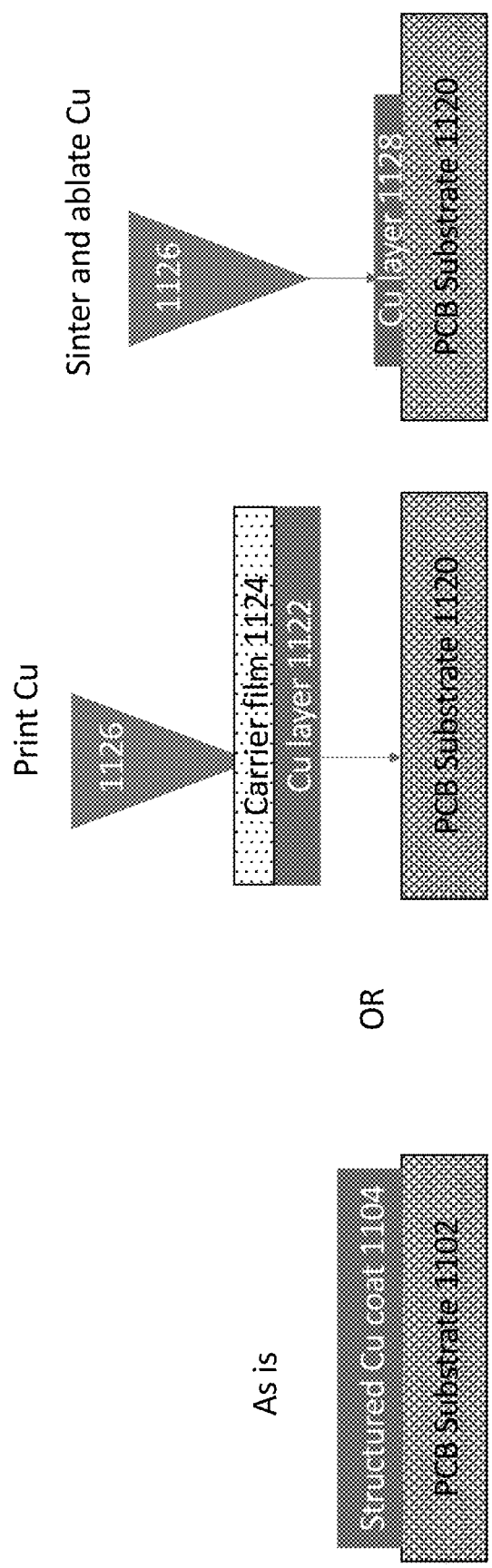

As shown in FIG. 11b, fabrication of the single-sided, multilayer PCB begins with obtaining a PCB substrate (FR4 or other) 1102 having a copper (or other metal) cladding layer 1104 disposed on one side thereof. It is possible to purchase PCB substrates with a copper cladding layer and, in one embodiment of the invention, these may be used as a starting material and the copper cladding layer etched by laser to remove excess material, leaving the desired Cu line forms on the PCB substrate. Alternatively, as shown in the illustration, a bare substrate (FR4 or other) 1120 may be provided to a laser jetting station such as one described above, and copper (or other metal) lines created on one side thereof through laser jetting of a copper layer 1122 coated on a donor substrate 1124 using a laser beam 1126. Once any solvent has dried, the copper layer 1128 jetted onto the surface of the PCB substrate 1120 is sintered and excess copper removed through ablation. The sintering and ablation processes may be performed using the same laser 1126, albeit at different energy than is used for the jetting process. Alternatively, a different laser may be used for sintering and ablation.

Figure 11C:
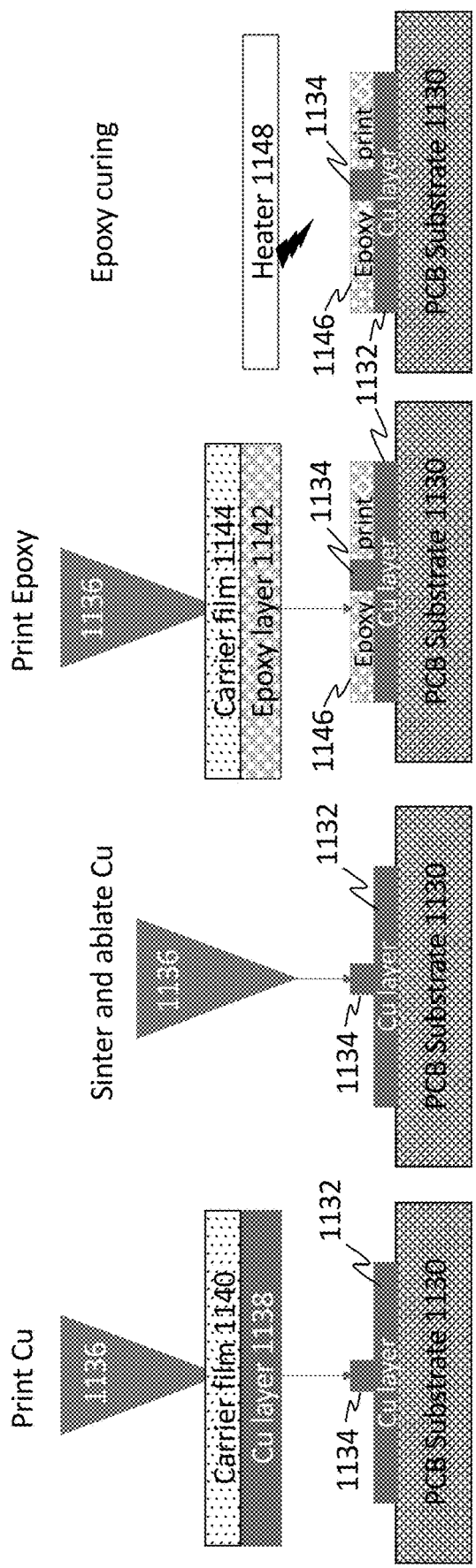

After the first copper layer has been formed, a second layer is added to form connectors to additional layers. FIG. 11c illustrates one example for printing copper connectors 1134 on top of a first copper layer 1132 on a PCB substrate 1130. In this example, printing is by laser jetting of copper droplets from a copper film or coating 1138 carried on a donor substrate 1140, in the fashion described above. A sufficient number of droplets are jetted for each connector 1134 using a laser 1136. Thereafter, the connectors 1134 are sintered and, if necessary, ablated to form precise shapes having desired dimensions. As before, the sintering and ablation may make use of the same laser 1136 used for printing the connectors, at different energies, if needed. Following sintering and ablation of the copper connectors, an epoxy layer 1146 is added by laser jetting of an epoxy coating 1142 carried on a donor substrate 1144. The same laser 1136 may be used to print the epoxy layer 1146 and subsequently, the epoxy layer 1146 is heated 1148 in order to cure the layer.

Figure 11D:
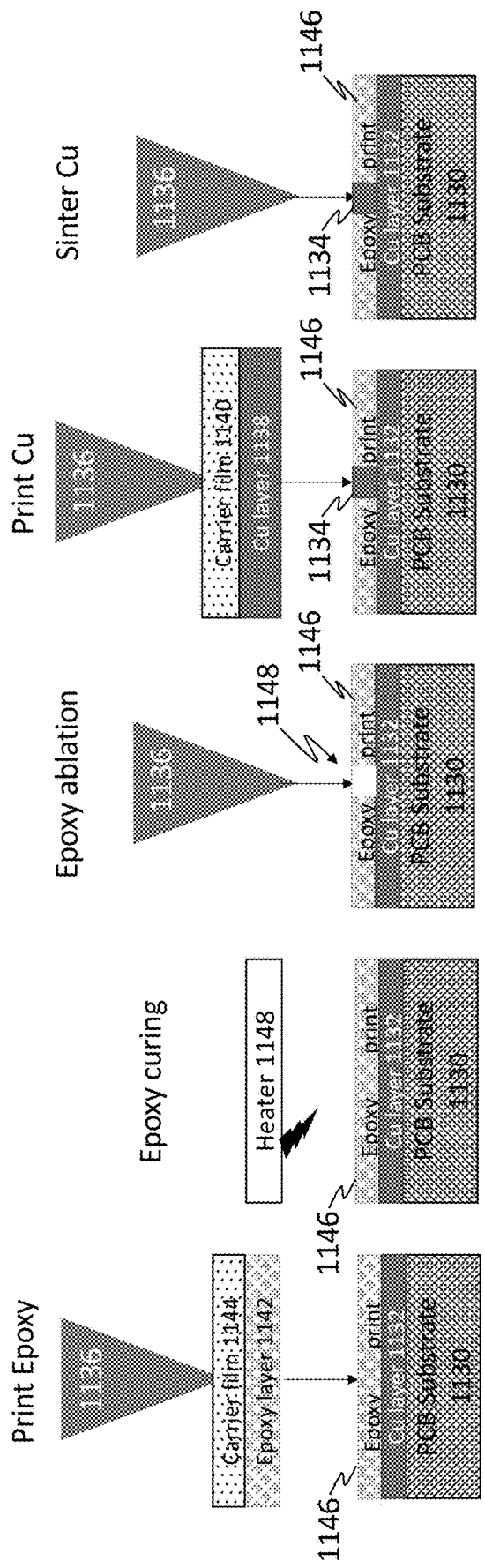
Figure 11E:
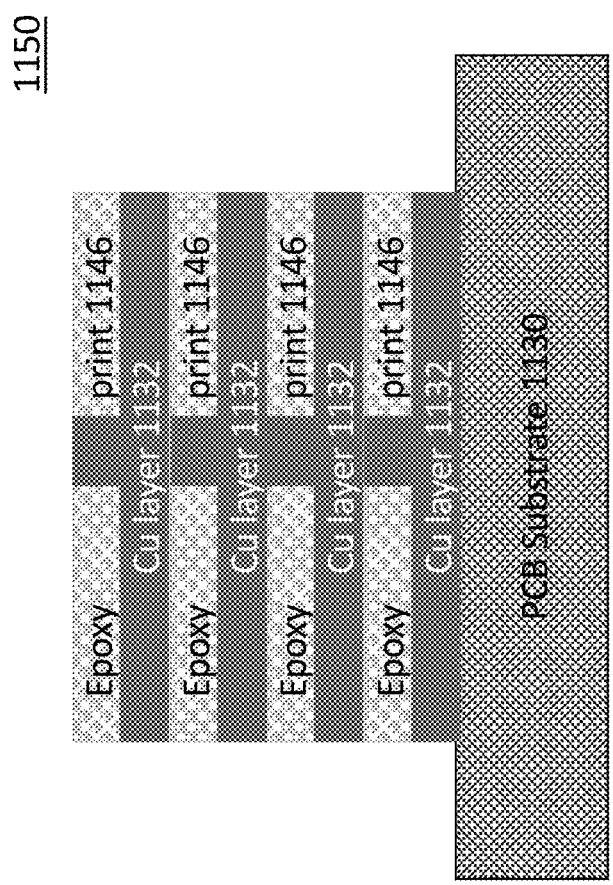

In an alternative process, illustrated in FIG. 11d, the epoxy layer 1146 is printed by laser jetting onto the first copper layer 1132, cured, and then holes/vias 1148 are ablated in the epoxy layer in locations at which connectors will ultimately be formed. Thereafter, the copper connectors 1134 are printed by laser jetting in the holes/vias 1148 that were created in the epoxy layer. The structure is completed with additional drying and sintering. The processes presented in FIGS. 11c and/or 11d may be repeated multiple times to create a multilayered structure 1150, illustrated in FIG. 11e.

Figure 11F:
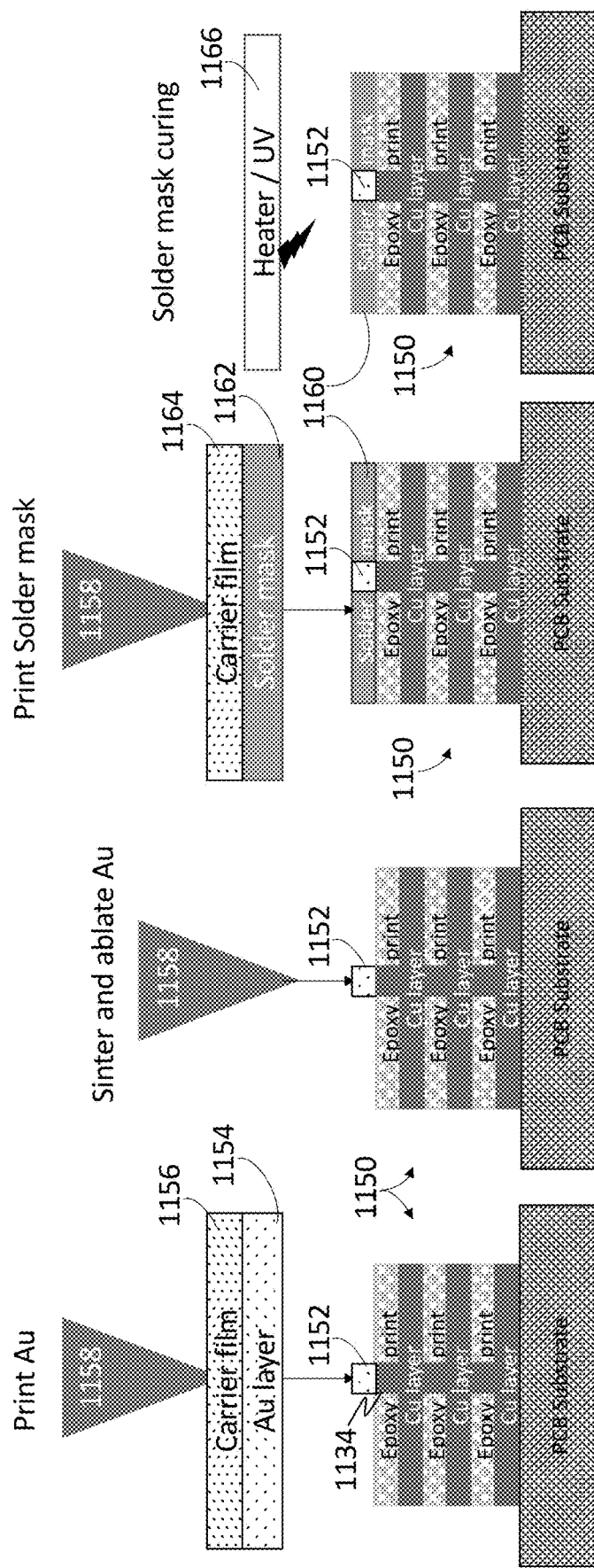

Once a desired number of metal (e.g., copper) and epoxy layers have been formed, electrical connectors and a solder mask layer may be printed. FIG. 11f illustrates one example of such procedures. First, gold connectors 1152 are printed by laser jetting on top of the copper connectors 1134 to create a conductive connection. The laser jetting process uses a laser beam 1158 to jet gold droplets from a gold film or paste 1154 coated on a donor film or substrate 1156 as described above. Then, the gold connectors 1152 are dried and sintered, and ablated if needed, and a solder mask layer 1160 is jet printed on the surface epoxy layer and cured either heat and/or UV light 1166. The laser used for the sintering, ablation (if needed), and printing of the solder mask layer may be the same as is used for printing the gold connectors and/or used for printing the copper connectors, with energies adjusted accordingly.

Figure 11G:
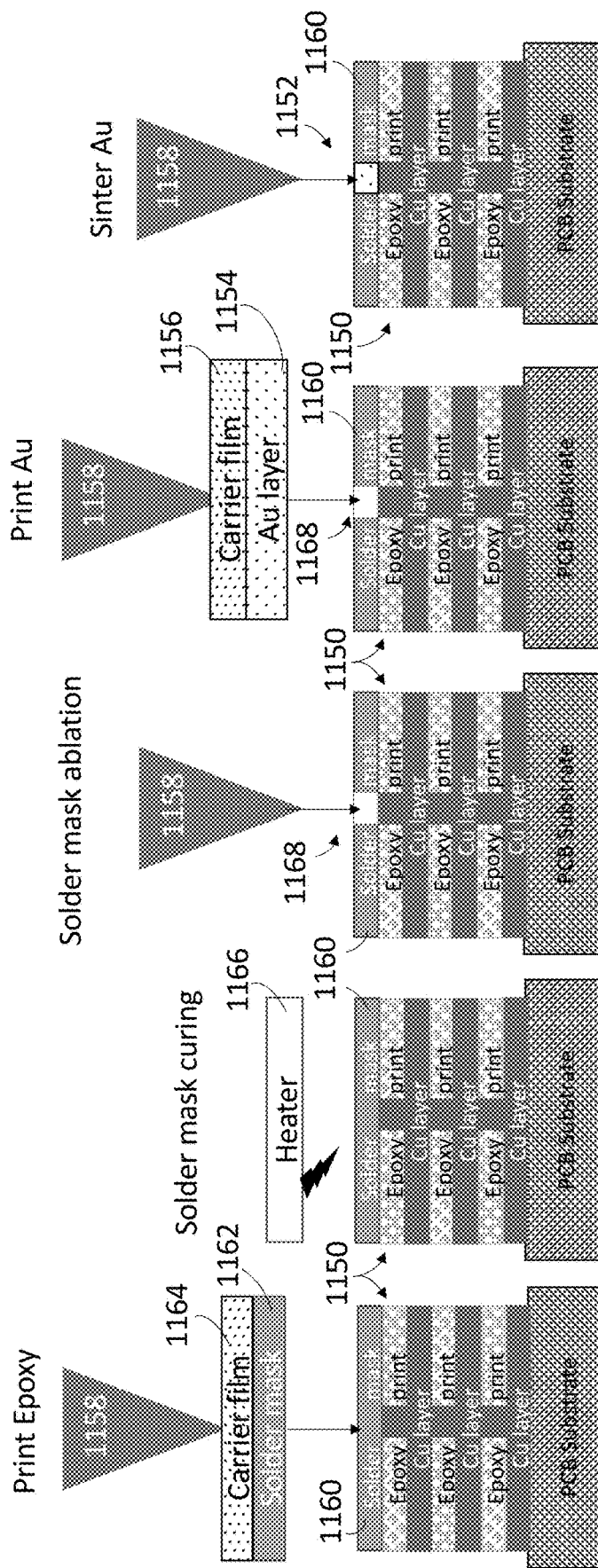

As shown in FIG. 11g, the same result may be achieved by first jet printing the solder mask layer 1160, curing it by heating or UV irradiation 1166, and then ablating the solder mask layer 1160 to create holes 1168 for placing the gold connectors 1152. The gold connectors 1152 are printed and sintered as described above.

Figure 12A:
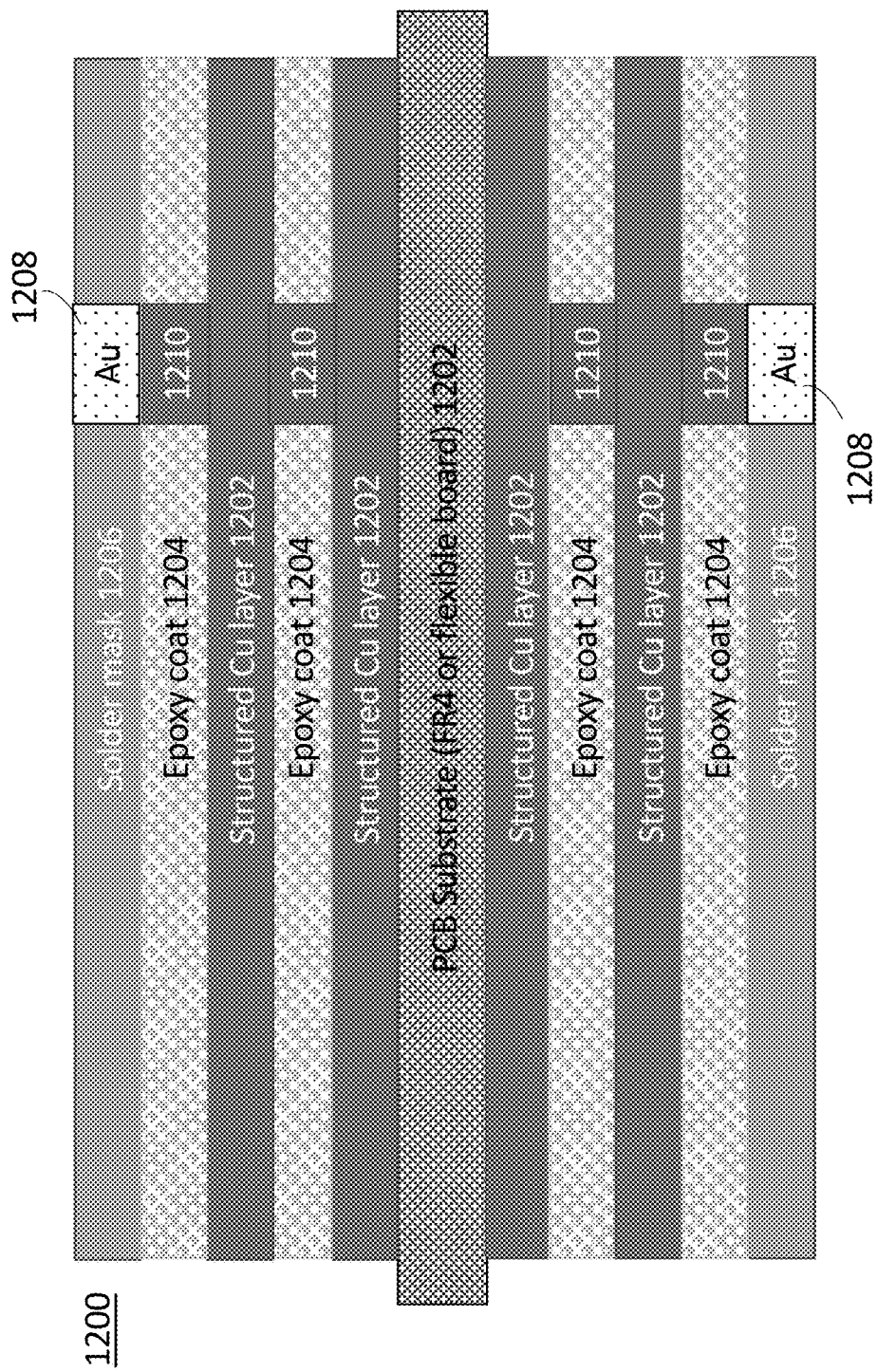
FIGS. 12a-12d illustrate aspects of a production cycle of a double-sided multilayer PCB board from substrate to a final board, in accordance with embodiments of the present invention.

The process for forming a double-sided, multilayer PCB is similar to that as described above for creating a single-sided, multilayer PCB, except that some accommodations are needed due to the need for drilling from both sides. Referring to FIG. 12a, a double-sided, multilayer PCB 1200 includes a PCB substrate 1202 on each side of which are one or more metal (e.g., copper) layers (traces) 1202, each separated by a layer of epoxy 1204. On each side, the final epoxy payers are covered by a solder mask layer 1206 and gold (or other metal) connectors 1208 are added at positions at which electrical components will be connected. The gold connectors 1208 are electrically connected to lower copper layers by copper-(or other metal-) filled vias and holes 1210 in the epoxy layers.

Figure 12B:
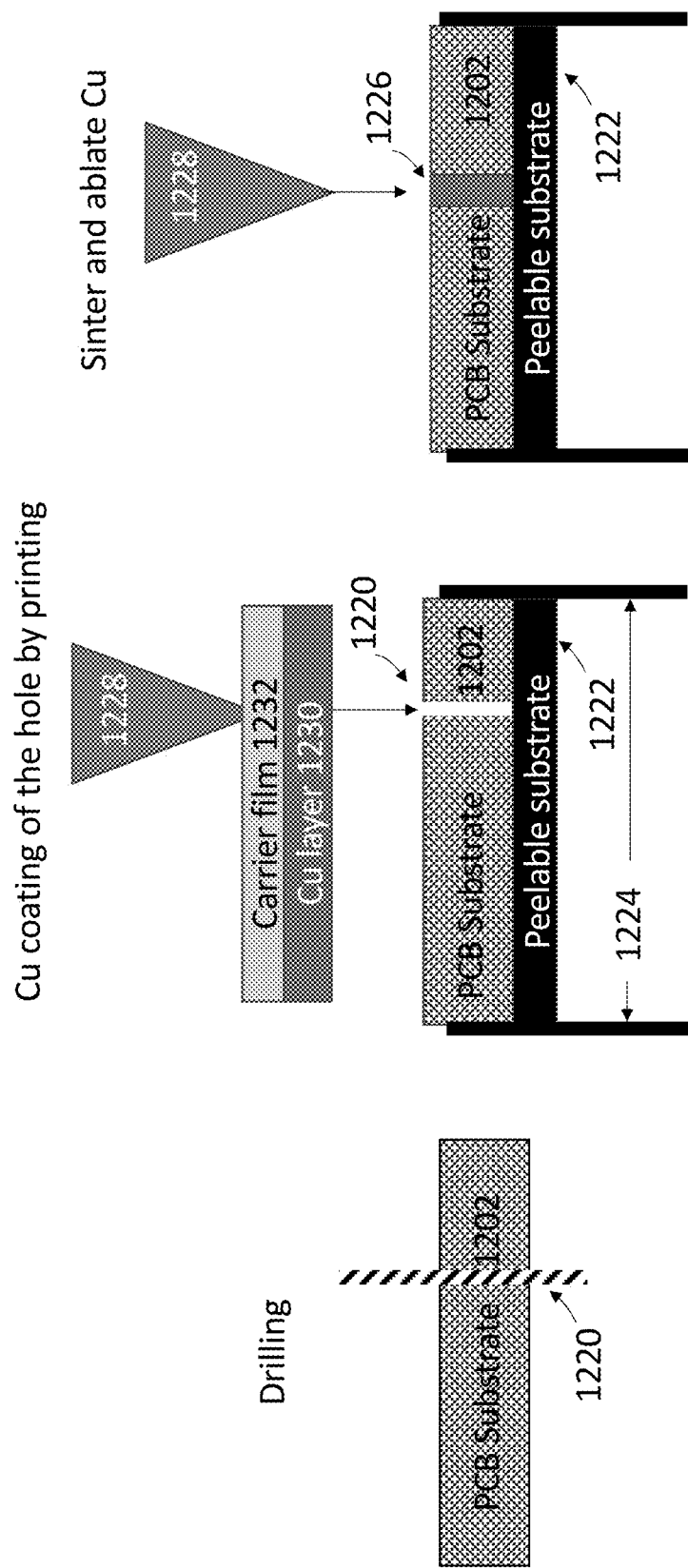

There are different available alternatives for providing the holes on each side of the PCB substrate 1202. Referring to FIG. 12b, in one embodiment, one or more through holes 1220 may be drilled in PCB substrate 1202, with the drilling tool passing through the entire thickness of the PCB substrate. In such a case, it is preferable to subsequently provide a peelable substrate 1222 beneath the PCB substrate 1202 after the drilling is complete in order to accommodate the jet printing of the copper (or other metal) filler into the hole, without contaminating the sample holder. Also, a sample holder 1224 that secures the PCB substrate from its edges should be used. Using a laser 1228, copper (or other metal) is jet printed from a film or paste 1230 on a donor substrate 1232 in the fashion described above so as to fill the hole 1220. Subsequently, the copper fill 1226 is sintered (e.g., using the same laser 1228) in place in the hole. Thereafter, the peelable substrate 1222 and sample holder 1224 may be removed.

Figure 12C:
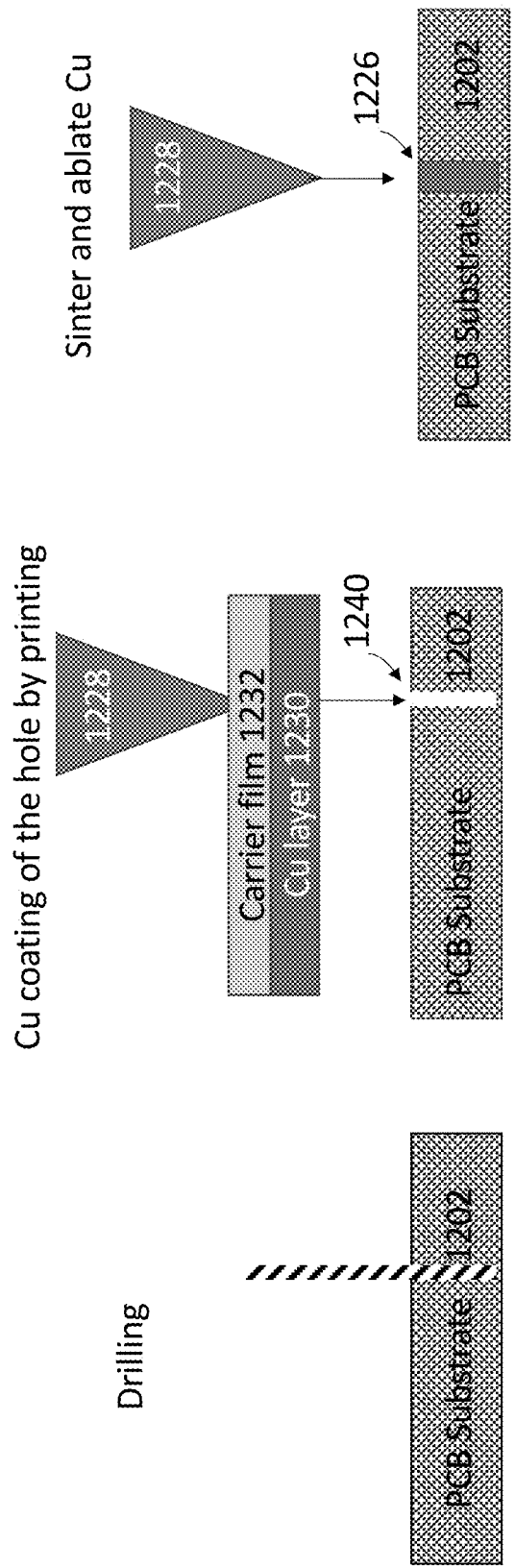
Figure 12D:
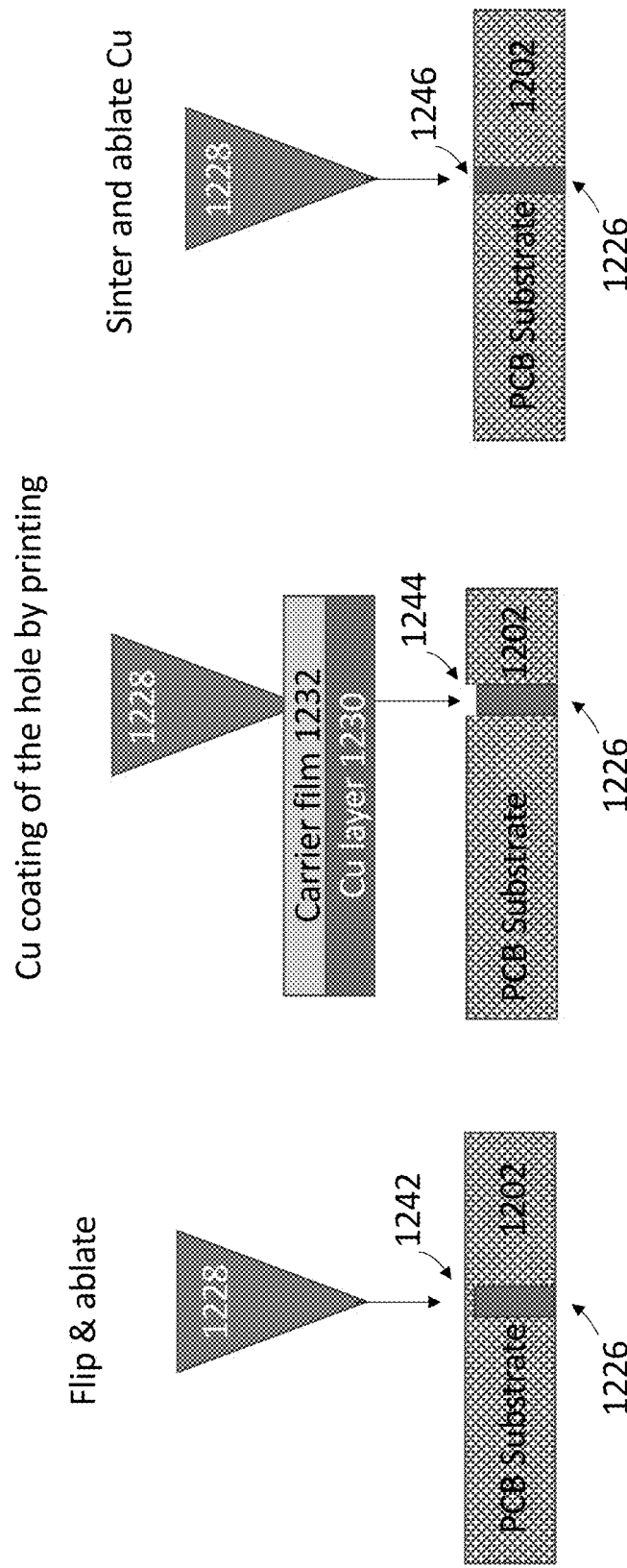

Referring to FIGS. 12c and 12d, another option is to drill a hole 1240 in one side of the PCB substrate 1202, taking care that the hole 1240 does not pass all the way through the entire thickness of the PCB substrate. As before, the hole 1240 is filled with copper 1226 from a Cu film 1230 carried on a donor substrate 1232 by jet printing, and the Cu fill is subsequently dried, sintered, and ablated (if necessary). Thereafter, referring to FIG. 12d, the PCB substrate 1202 is flipped, and the laser 1228 is used to complete the through hole by removing the remaining portion 1242 of the PCB substrate opposite the Cu fill 1226. This leave a small hole 1244 to be filled with copper by jet printing, as above, and the printed copper 1246 is again dried and sintered as discussed above.

It is also possible to add a pick and place machine to the system so as to provide for full assembly of the PCB with electronic components. FIGS. 13a-13i illustrate several examples of the inclusion of embedded and other electronic components facilitated through the use of such a machine in accordance with embodiments of the present invention. In these examples, a single-sided, multi-layer PCB is discussed. This is primarily for ease of illustration; however, it should be appreciated that the discussion applies equally to double-sided, multilayer PCBs fashioned in accordance with the present invention. In the case of double-sided PCBs, the board may be flipped when working on a reverse side, or pick and place apparatus may be provided on both sides of a PCB supported at its edges so as to allow component situation and mounting on both sides simultaneously or nearly so.

Figure 13A:
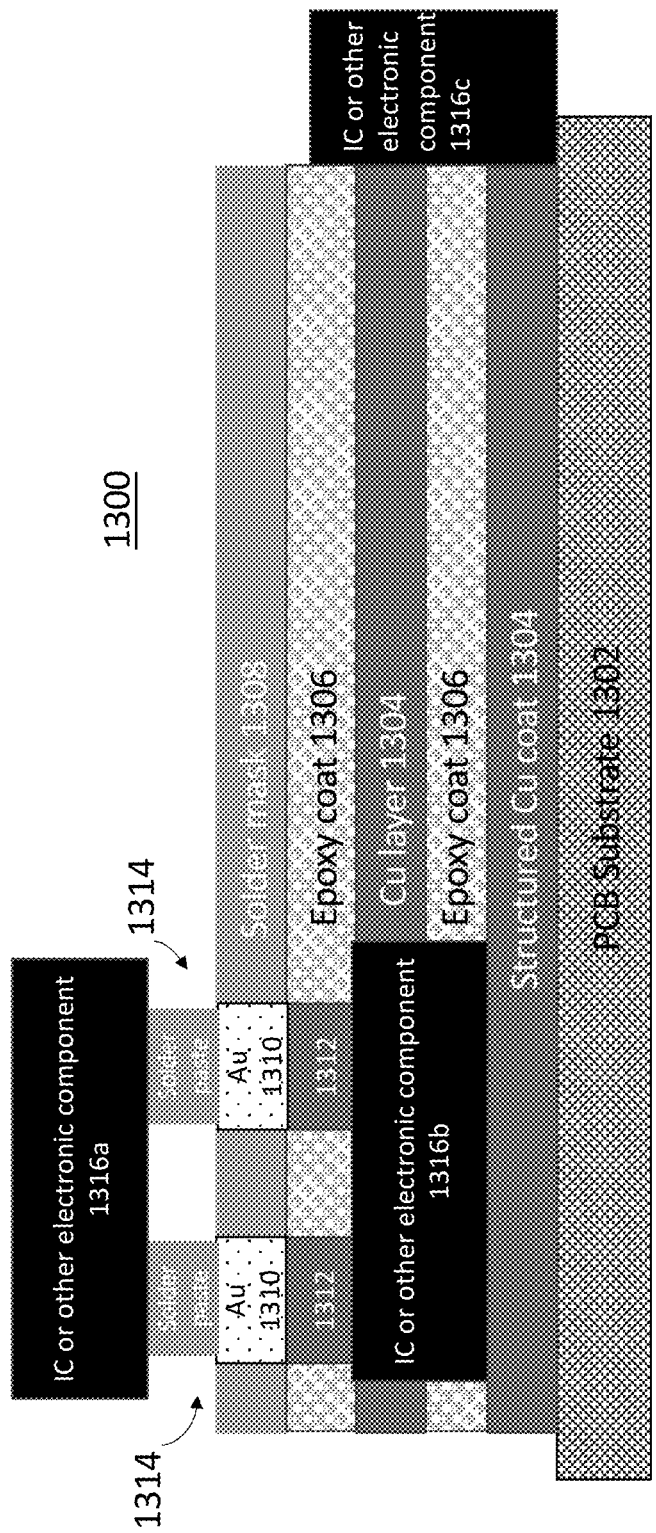
FIGS. 13a-13i illustrate aspects of a production cycle of a PCB with embedded electronics, in accordance with embodiments of the present invention.

FIG. 13a illustrates a PCB assembly 1300, which includes a PCB substrate 1302 made of, for example, FR4 or a flexible board, on which is disposed a plurality of metal (e.g., copper) layers 1304 separated by epoxy layers 1306. The top-most epoxy layer is covered by a solder mask layer 1308 in which are located a plurality of gold (or other metal) connectors 1310, which are electrically coupled to metal (e.g., copper) connectors 1312. PCB assembly 1300 may be fabricated using the above-described PCB production systems and methods.

Also included in PCB assembly 1300 are a plurality of electronic components 1316a-1316c. Components 1316a-1316c may be integrated circuits (ICs) or other electronic components and are assembled into PCB assembly 1300 using a pick and place machine or similar system. In particular, components 1316a-1316c are situated so that leads associated therewith make electrical connections to connectors 1310, 1312, e.g., at solder pads 1314 or elsewhere. Solder pads 1314 may be deposited by LAD in a manner similar to the deposition of copper traces, solder masks, and/or connectors, as described above.

As shown, electronic components 1316a-1316c may be added to the PCB assembly at the top or sides of the structure and/or embedded within it. When added from the or sides, the electronic components may be electrically connected to the metal layers by connectors, as discussed above, or directly, as is the case with electronic component 1316c in the illustration. It is also possible to encapsulate an electronic component 1316b within the PCB assembly 1300. FIGS. 13b-13f further illustrate aspects of these various procedures for electrically connecting the electronic components.

Figure 13B:
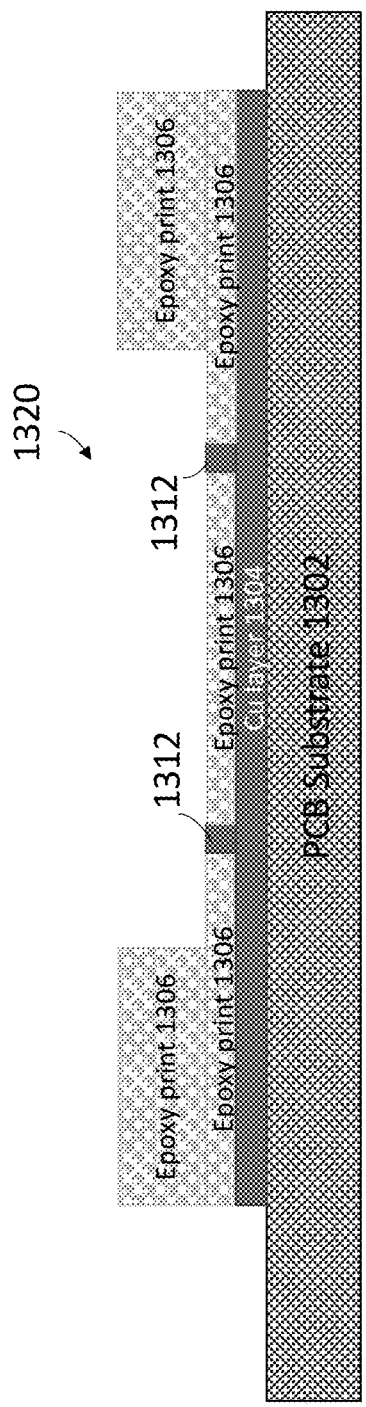

In FIG. 13b, a PCB substrate 1302 has been printed with a metal (e.g., copper) layer 1304 and one or more epoxy layers 1306 in the manner discussed above. Metal (e.g., copper) connectors 1312 have been printed in through holes in the epoxy layer(s) according to the processes described above. The connectors 1312 have been positioned to accommodate the placement of an electronic component. In one embodiment, the structure shown in FIG. 13b may be fashioned by selectively depositing epoxy by jetting so as to leave an open area 1320 for placement of the electronic component. Alternatively, the open area 1320 may be created through laser engraving (e.g., etching or ablation) of a layer of epoxy.

Figure 13C:
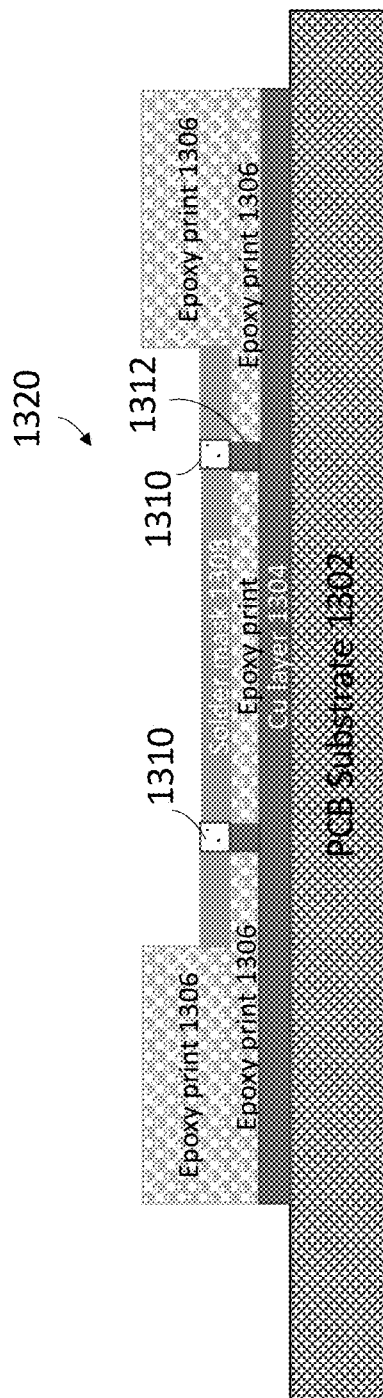
Figure 13D:
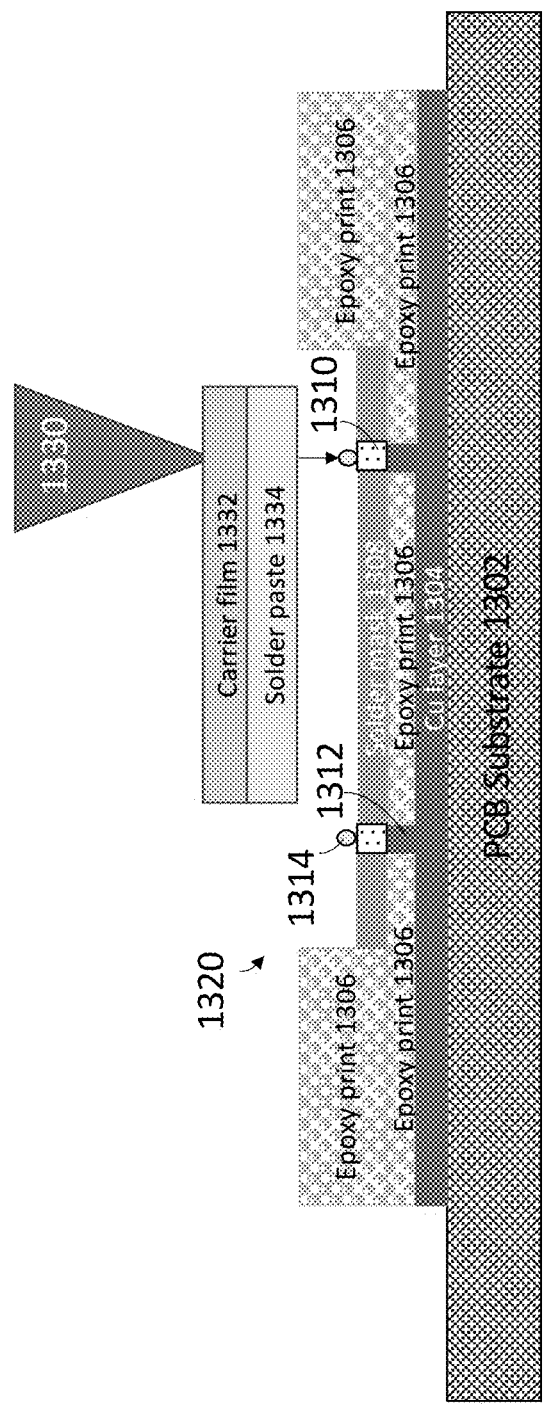
Figure 13E:
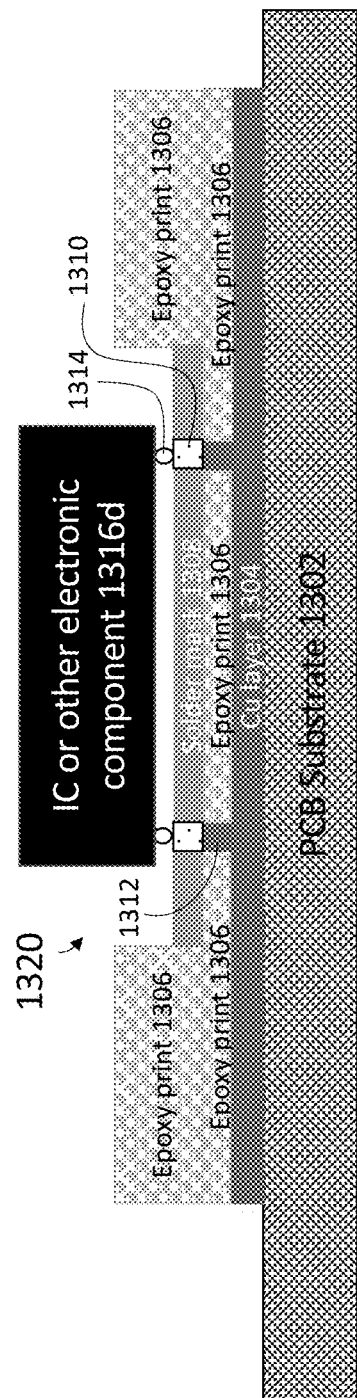

FIG. 13c shows a next step in preparing the structure to receive an electronic component. A solder mask layer 1308 has been deposited by LAD in the open area 1320 on top of the epoxy layer, and gold connectors 1310 have been fashioned therein so as to provide electrical coupling to the copper connectors 1312 below. Then, as shown in FIG. 13d, solder paste 1314 is jet printed onto the gold connectors 1310. The solder paste is printed by laser jetting using a laser 1330 and a donor substrate 1332 with solder 1334 coated thereon in the manner discussed above. An electronic component 1316d is then placed in the open area 1320 with its leads electrically connected to the solder paste areas 1314, for example using a conventional pick and place machine, as shown in FIG. 13e. Placement of the electronic component in this fashion may be observed using one or more imaging stations so as to ensure correct alignment of the leads with the solder paste locations.

Figure 13F:
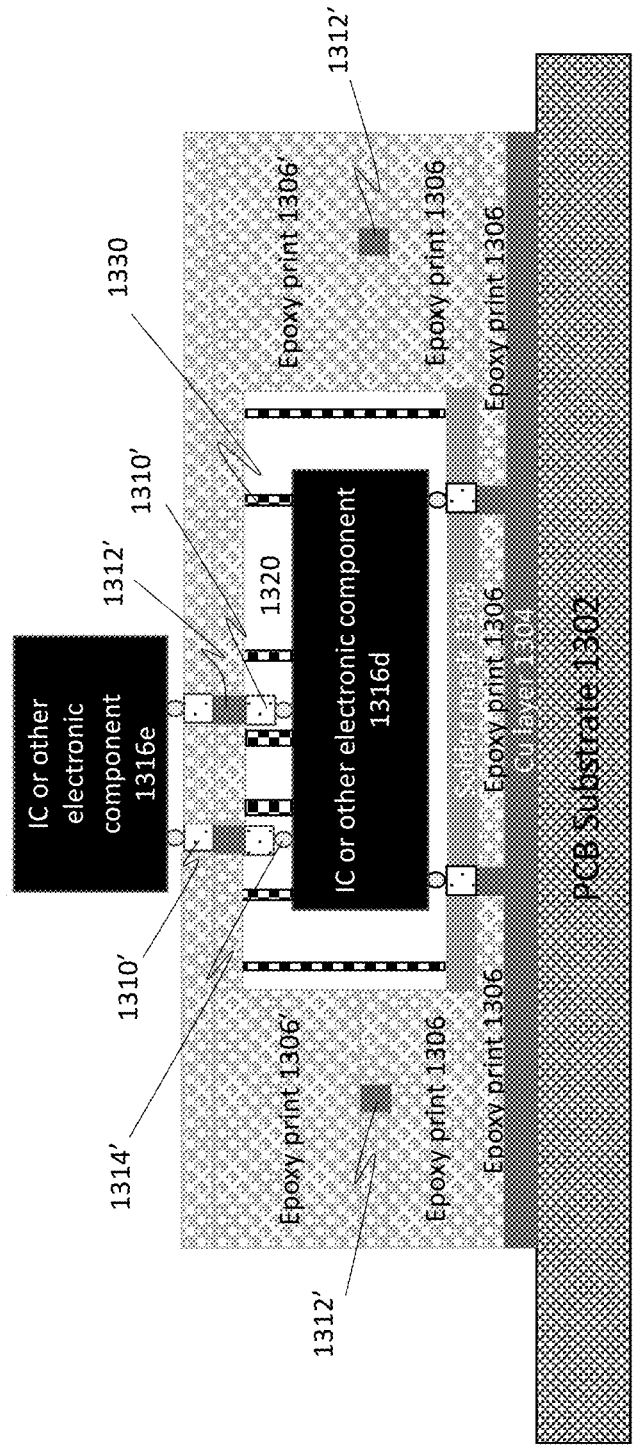

Through the printing of additional epoxy layers 1306', copper connectors 1312', gold connectors 1310', solder paste areas 1314', and (optionally) solder mask areas), additional electrical components 1316e may be added to the PCB assembly, as shown in FIG. 13f. As shown, electrical connections may be made to multiple sides of an electronic component 1316d, and in some cases additional metal (e.g., CU) layers, labels, etc. may be added as described above. During fabrication of this PCB assembly, support structures 1330 made of resin or other material may be added to provide temporary or permanent support for layers overlying open areas 1320. The support structures may be added by LAD in the manner discussed above for the printing of other layers.

Figure 13G:
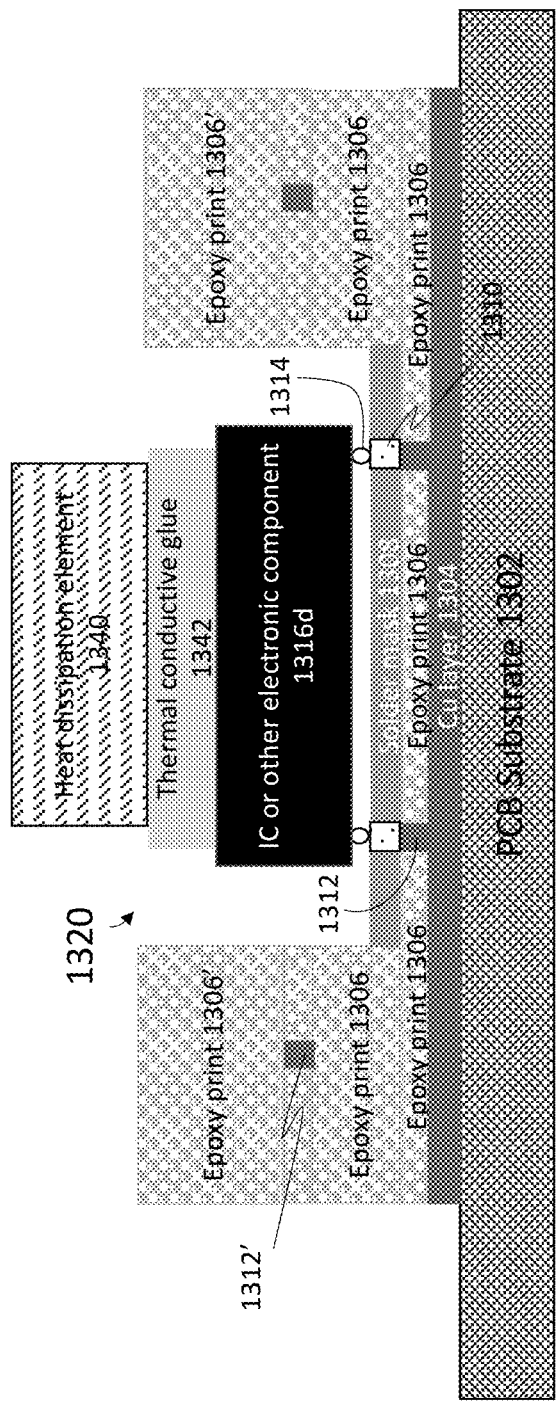

The assembly of a PCB structure is not limited to the placement of electronic components. Other structural components may be included in such a structure. FIG. 13g illustrates an example in which a heat dissipation element 1340 has been added by adhering the heat dissipation element (e.g., a metal plate or other thermal conductor) to electronic component 1316d by a layer of thermal conductive glue 1342. The thermal conductive glue may be printed by LAD in a fashion similar to that described above for the printing of metal layer or connectors, or solder masks or epoxies. The heat dissipation element may be placed by a pick and place machine or, in some cases, may be a printed structure formed by LAD.

Figure 13H:
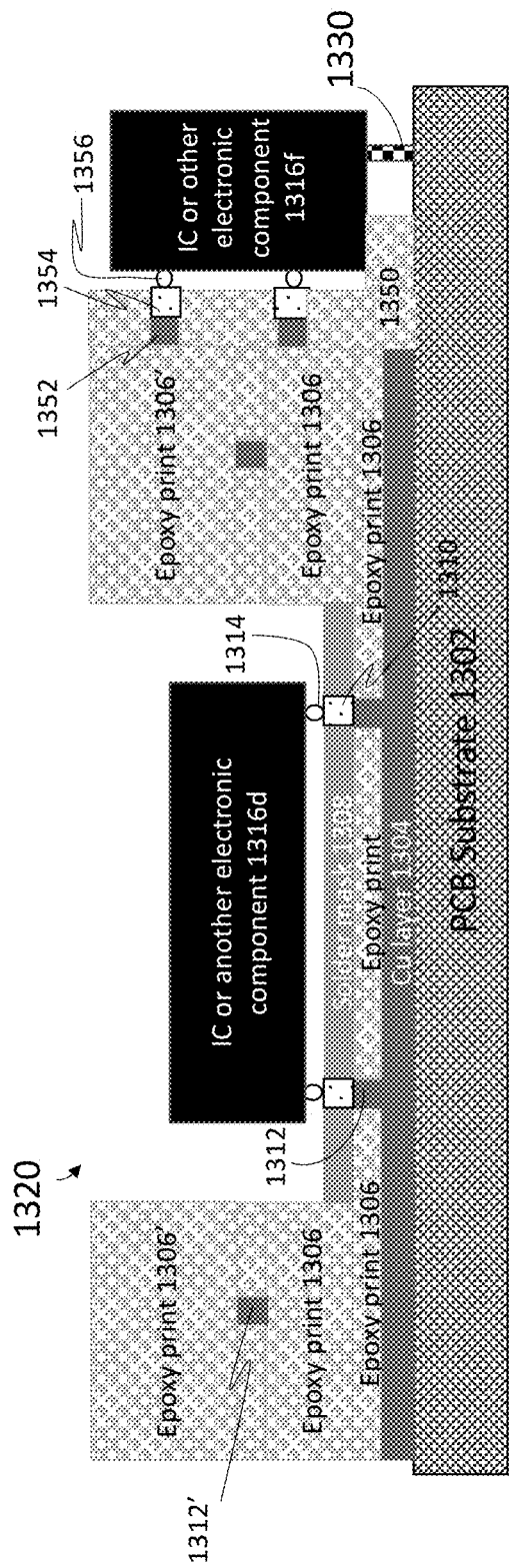
Figure 13I:
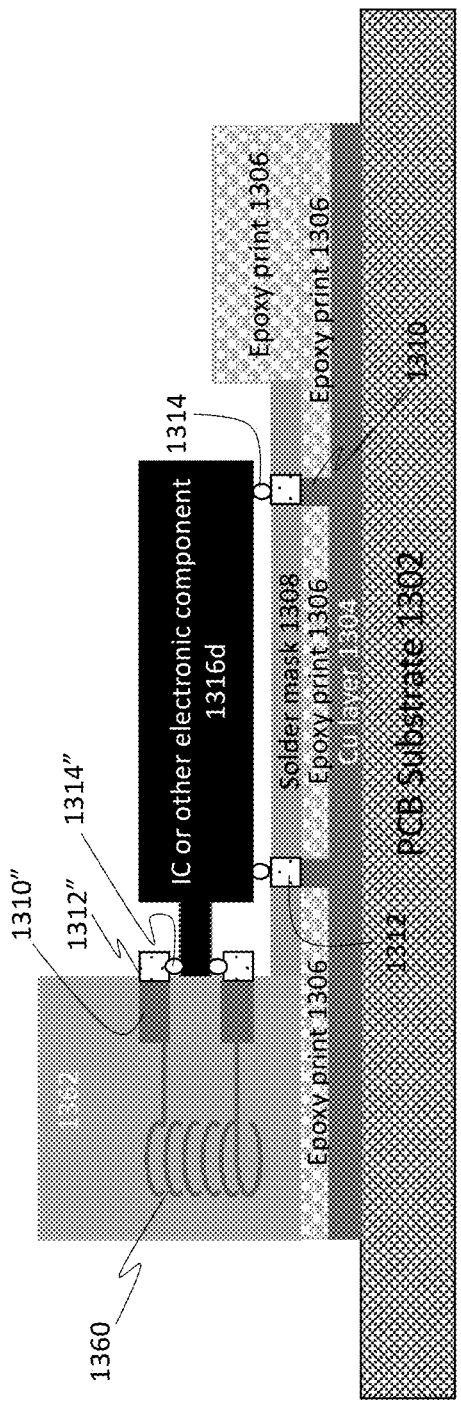

Nor is the assembly of a PCB structure is not limited to placement of electronic components in layer arrangement with other elements of the PCB structure. FIG. 13h illustrates placement of an electronic component 1316f such that its electrical leads are orthogonal to the plane of the PCB substrate 1302 and its overlying metal, epoxy, and other layers, and which are electrically connected via metal (e.g., Cu) connectors 1352, gold connectors 1354, and solder paste areas 1356 that are printed so as to accommodate this orientation. As shown, a temporary or permanent support structure 1330 may be printed so as to be used as a support for the electronic component when placed in this fashion. The printing of the various epoxy layers 1350, connectors 1352, 1354, and solder paste 1356 may be done in the manners discussed above using LAD. It may be necessary to maintain a portion of an epoxy layer in place while printing the solder paste, for example, so as not to contaminate structures and/or assemblies below. Although not shown, a solder mask layer may be printed, if needed.

And still another example of a PCB assembly accommodating embedded electronic components is illustrated in FIG. 13g. In this case, a coil 1360 is embedded in a epoxy layer 1362. The coil may be an existing component that is placed by a pick and place machine and electrically connected to another electronic component 1316d via metal (e.g., Cu) connectors 1310", gold connectors 1312", and solder joints 1314", which themselves are printed in the fashions discussed above, or the coil 1360 itself may be printed by LAD, for example as described in the present assignee's U.S. patent application Ser. No. 16/946,638, filed 30 Jun. 2020. For example, the coil may be printed by jetting metal from a coating or foil on a donor substrate, similar to the method discussed above for printing metal layers, with the jetted material printed in successive layers so as to partially overlap a most-recently printed element and thereby define a helical pattern of coil elements that collectively make up the coil 1360. The coil elements may be printed within the supporting epoxy 1362 and/or about an inner core (not shown), which act (singularly or collectively) as scaffolds to keep the coil under construction intact as the coil elements fuse with one another. Alternatively, the coil 1360 may be printed by LAD as a plurality of partially complete rounds, each in a respective layer, with pillars interconnecting successive ones of the partially complete rounds in different ones of the respective layers. The pillars may be vertical, or near-vertical and positions of the pillars between successive ones of the plurality of partially complete rounds may be staggered across the circumference of the partially complete rounds. Following printing of one of the plurality of partially complete rounds in a respective layer, for a number of successive layers of metal corresponding to a desired pillar height, only a connecting pillar is printed. Epoxy scaffolding elements may be printed as part of each respective layer of material concurrently with printing the plurality of partially complete rounds. Embedding coils in this fashion may provide for embedded radio frequency identification (RFID) tags within the PCB assembly.

Figure 14A:
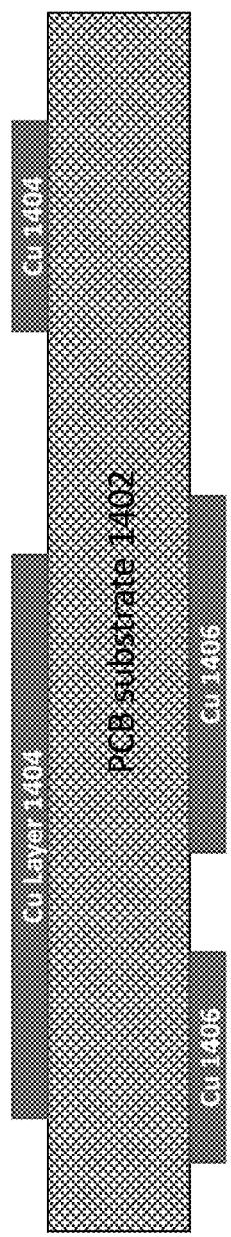
FIGS. 14a-14d illustrate aspects of a production cycle of a PCB in which laser assisted deposition is used for some aspects of PCB fabrication.
Figure 14B:
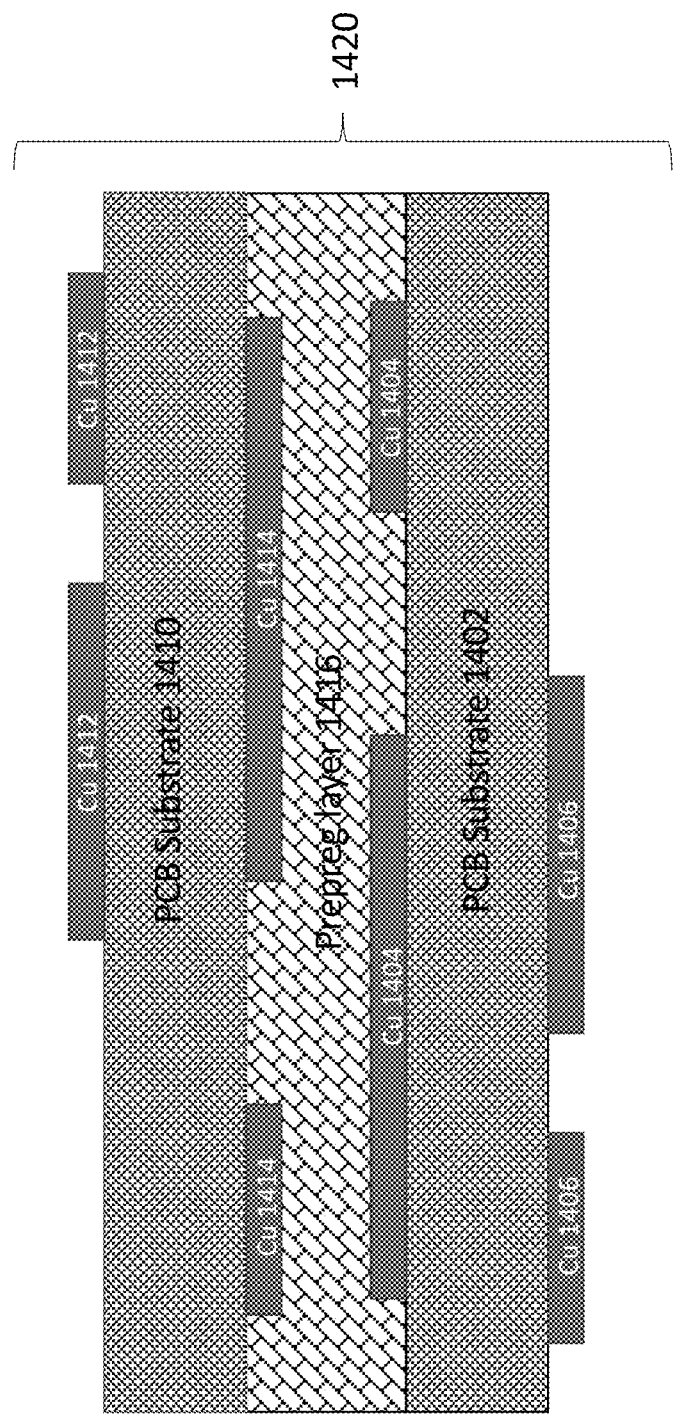
Figure 14C:
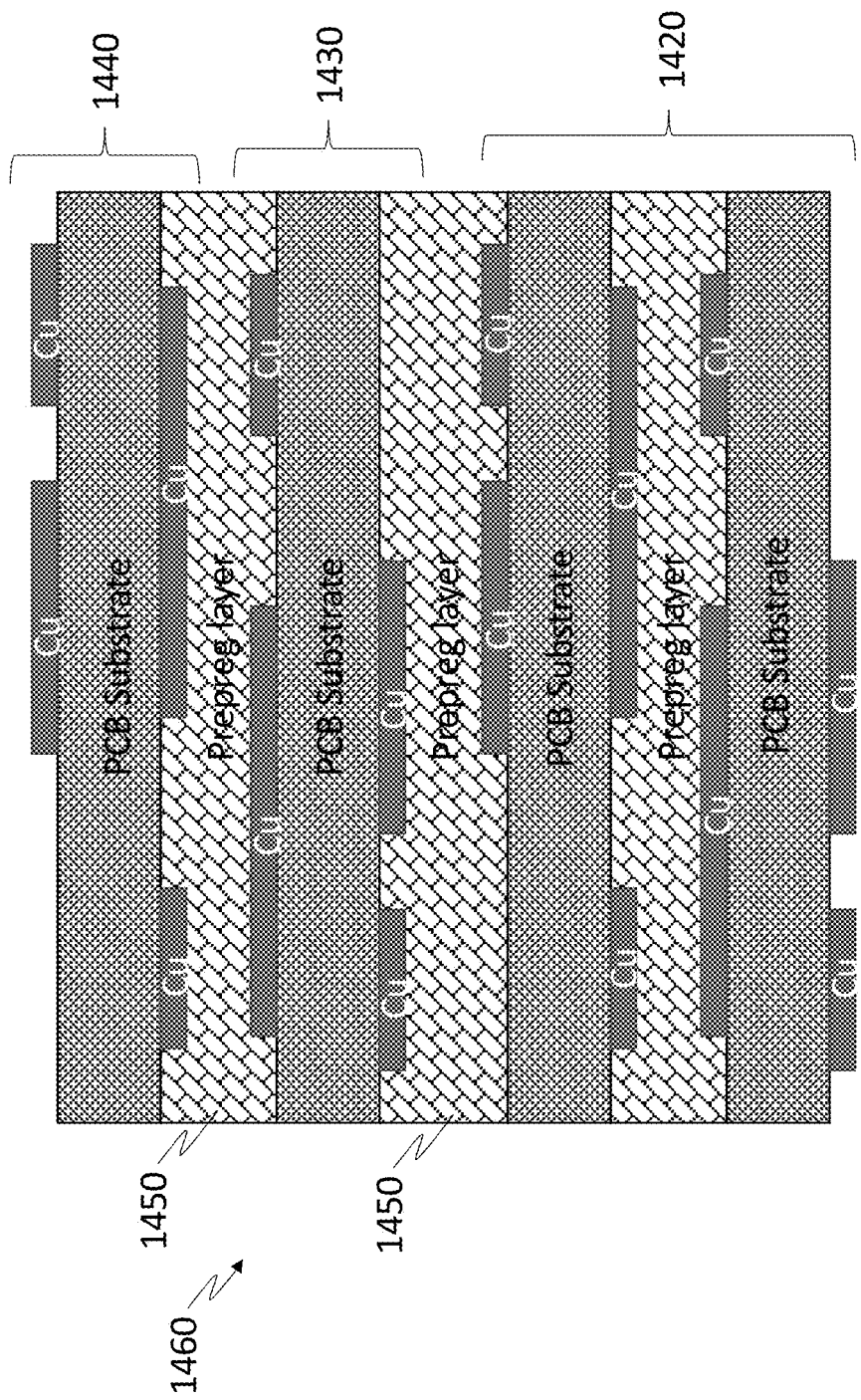
Figure 14D:
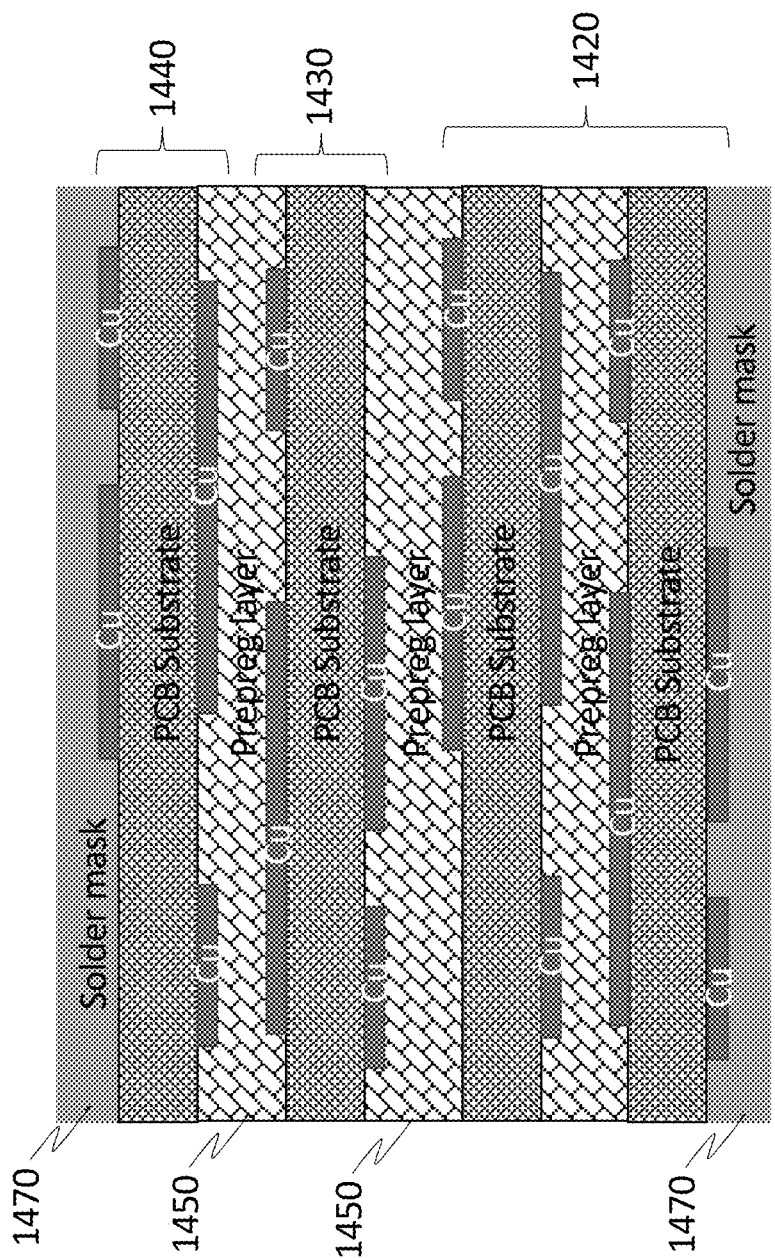

FIGS. 14a-14d illustrate aspects of a production cycle of a PCB in which laser assisted deposition or another laser-based printing process is used for some aspects of PCB fabrication. In FIG. 14a, metal layers (e.g., Cu) 1404, 1406 are printed on both sides of a PCB substrate 1402 using LAD or another laser-based printing process, as described above. In FIG. 14b, the double-sided PCB from FIG. 14a is stacked with a similarly fabricated double-sided PCB consisting of metal layers (e.g., Cu) 1412, 1414 printed on both sides of a PCB substrate 1410 with a prepeg layer 1416 between them. The prepeg layer 1416 may be a conventional resin-based prepeg (and may be made of the same material as the PCB core substrate), and the stacking process may be performed by conventional means used in the PCB fabrication industry. The result is an assembly 1420.

As shown in FIG. 4c, the stacking process may be repeated with additional double-sided PCBs 1430, 1440, etc., each time including a prepeg layer 1450 between the new double sided PCB and the previous assembly. When the assembly includes two or more double-sided PCBs with interdigitated prepegs, as shown in the illustration, it is subjected to a lamination process using a conventional hot pressing process and a photosensitive dry resist. The result is a multi-board stack 1460. Then, as shown in FIG. 4d, solder mask layers 1470 may be printed on each side of the multi-board stack using LAD or another laser-based printing process, as described above. Although not shown in detail, gold, silver, or other pads, and solder as well as labels may also be printed on each side of the multi-board stack using LAD or another laser-based printing process, as described above. Drilling of the PCBs and/or copper plating following drilling may be performed using conventional processes for such activities.

Although not illustrated in detail, it should be appreciated that the various components of the printing systems described herein operate under the control of one or more controllers, which, preferably, are processor-based controllers that operate under the instruction of machine-executable instructions stored on tangible machine-readable media. Such controllers may include a microprocessor and memory communicatively coupled to one another by a bus or other communication mechanism for communicating information. The memory may include a program store memory, such as a read only memory (ROM) or other static storage device, as well as a dynamic memory, such as a random-access memory (RAM) or other dynamic storage device, and each may be coupled to the bus for providing and storing information and instructions to be executed by the microprocessor. The dynamic memory also may be used for storing temporary variables or other intermediate information during execution of instructions by the microprocessor. Alternatively, or in addition, a storage device, such as a solid state memory, magnetic disk, or optical disk may be provided and coupled to the bus for storing information and instructions. The controller may also include a display, for displaying information to a user, as well as various input devices, including an alphanumeric keyboard and a cursor control device such as a mouse and/or trackpad, as part of a user interface for the printing system. Further, one or more communication interfaces may be included to provide two-way data communication to and from the printing system. For example, network interfaces that include wired and/or wireless modems may be used to provide such communications.

What is claimed is:

1. A method of fabricating a printed circuit board (PCB) assembly, comprising depositing a layer of metal on a PCB substrate by laser-assisted deposition (LAD) in which jetting of metal droplets from a first donor substrate onto the PCB substrate and/or into one or more holes therein is effected using a laser to form the layer of metal on the PCB substrate, the layer of metal being subsequently dried and sintered, with the jetting, drying, and sintering being repeated until the layer of metal reaches a desired thickness, and thereafter forming at least one passivation layer over the layer of metal by jetting an epoxy from a second donor substrate using the same laser that was used for forming the layer of metal on the PCB to form a layer of the epoxy.

2. The method of fabricating the PCB assembly as in claim 1, further comprising ablating the layer of metal if it exceeds the desired thickness.

3. The method of fabricating the PCB assembly as in claim 2, wherein the ablating is performed using the laser used to jet the metal droplets from the first donor substrate.

4. The method of fabricating the PCB assembly as in claim 1, further comprising printing an additional metal layer over the layer of epoxy by LAD.

5. The method of fabricating the PCB assembly as in claim 4, wherein the layer of metal includes a first metal trace, the epoxy layer includes at least a first portion of epoxy that covers at least a first portion of the first metal trace, and the additional metal layer includes a second metal trace having at least a portion disposed over the first portion of the epoxy layer that covers the first portion of the first metal trace.

6. The method of fabricating the PCB assembly as in claim 1, further comprising curing the layer of epoxy by hot air and/or infrared (IR) irradiation.

7. The method of fabricating the PCB assembly as in claim 1, wherein the one or more holes in the PCB substrate are formed in a first side of the PCB substrate by drilling or laser engraving the first side of the PCB substrate, but do not pass through an entire thickness of the PCB substrate, the layer of metal is formed in the one or more holes by LAD from the first side of the PCB substrate, the PCB substrate is subsequently flipped and the one or more holes are completed through the thickness of the PCB substrate by drilling or laser engraving through a second side of PCB substrate, and remaining portions of the one or more holes exposed by the drilling or laser engraving through the second side of PCB substrate are metalized by LAD.

8. The method of fabricating the PCB assembly as in claim 1, further comprising printing a solder mask layer over the at least one passivation layer and any intervening layers and/or components of the PCB assembly, the solder mask layer being printed by LAD.

9. The method of fabricating the PCB assembly as in claim 8, further comprising printing a label by LAD over the solder mask layer.

10. The method of fabricating the PCB assembly as in claim 9, further comprising printing metal connectors in holes in the solder mask layer by LAD.

11. The method of fabricating the PCB assembly as in claim 1, further comprising printing metal connectors in holes in the layer of epoxy by LAD.

12. A method of fabricating of a printed circuit board (PCB) assembly, comprising printing, by laser assisted deposition (LAD) a metal onto an epoxy laminate, the metal being jetted as droplets from a metal coating or foil on a donor substrate by a laser into channels and/or holes created in the epoxy laminate by laser engraving, and subsequently attaching the epoxy laminate to a PCB substrate or a previously formed epoxy layer disposed over the PCB substrate by hot pressing to form at least a portion of the PCB assembly, with the metal jetted into the channels and/or holes of the epoxy laminate being between the PCB substrate and an upper surface of the epoxy laminate in the portion of the PCB assembly and the epoxy laminate forming a passivation layer over the metal.

13. The method of fabricating the PCB assembly as in claim 12, further comprising printing a solder mask layer over the upper surface of the epoxy laminate and any intervening layers and/or components of the PCB assembly, the solder mask layer being printed by LAD.

14. The method of fabricating the PCB assembly as in claim 13, further comprising printing metal connectors in holes in the solder mask layer by LAD.

15. The method of fabricating the PCB assembly as in claim 13, further comprising printing a label by LAD over the solder mask layer.

16. A method for fabricating a printed circuit board (PCB) assembly, comprising:
   drilling or laser engraving one or more vias in a PCB substrate from a first side of the PCB substrate, the vias not extending through an entire thickness of the PCB substrate;
   depositing, by laser-assisted deposition (LAD), a metal paste over at least a first portion of the PCB substrate and into the one or more vias to a first thickness, the depositing performed by jetting metal paste from a donor film on a first carrier substrate by an incident laser beam onto the PCB substrate and into the one or more vias, curing the metal paste deposited on the at least first portion of the PCB substrate and into the one or more vias, and sintering the deposited and cured metal paste using a same laser that was used for depositing the metal paste, and repeating the depositing, curing and sintering of the metal paste, thereby forming successive thicknesses thereof on the PCB substrate and in the one or more vias, until a desired thickness of the metal paste on the PCB substrate and in the one or more vias is reached;
   printing a passivation layer by LAD on the desired thickness of metal paste on the PCB substrate and in the one or more vias, the printing performed by jetting epoxy from a second carrier substrate using the same laser that was used for depositing the metal paste, and curing the passivation layer; and
   forming a solder mask by LAD over the passivation layer, the solder mask being formed by jetting mask material from a third carrier substrate using the same laser that was used for depositing the metal paste, and curing the solder mask.

17. The method of fabricating the PCB assembly of claim 16, wherein the solder mask layer is cured using heat or ultraviolet (UV) irradiation.

18. The method of fabricating the PCB assembly of claim 17, wherein the passivation layer is cured using heat or infrared (IR) irradiation.

19. The method of fabricating the PCB assembly of claim 18, wherein the metal paste is cured using heat or infrared (IR) irradiation.

20. The method of fabricating the PCB assembly of claim 19, wherein the PCB substrate is moved between the drilling, the depositing, the printing, and the forming processes on a stage translatable between positions at which the drilling, the depositing, the printing, and the forming processes take place.

21. The method of fabricating the PCB assembly of claim 19, wherein the processes of depositing of metal paste and printing of passivation layers are performed multiple times prior to forming the solder mask so as to form multiple layers of both metal paste and epoxy between the PCB substrate and the solder mask.

22. The method of fabricating the PCB assembly of claim 19, further comprising forming first metal electrical connectors for an electronic component within the passivation layer prior to forming the solder mask.

23. The method of fabricating the PCB assembly of claim 22, further comprising forming second metal electrical connectors for the electronic component within the solder mask.

24. The method of fabricating the PCB assembly of claim 23, wherein the first metal electrical connectors are formed from a different metal than the second metal electrical connectors.

25. The method of fabricating the PCB assembly of claim 23, further comprising attaching the electronic component to the second metal electrical connectors by one or more solder joints.

26. The method of fabricating the PCB assembly of claim 25, further comprising forming one or more additional passivation layers and/or solder mask layers over the electronic component.

27. The method of fabricating the PCB assembly of claim 25, further comprising printing one or more support structures for the electronic component by LAD prior to attaching the electronic component to the second metal electrical connectors.

28. The method of fabricating the PCB assembly of claim 16, wherein the desired thickness of the metal paste on the PCB substrate forms at least a first metal trace and the passivation layer includes at least a first portion that covers a corresponding first portion of the first metal trace, the method further comprising printing a second metal trace over the first portion of the passivation layer.

29. The method of fabricating the PCB assembly of claim 28, wherein the second metal trace is printed using LAD.

* * * * *